(12) United States Patent
Tomita et al.

(10) Patent No.: US 7,652,467 B2
(45) Date of Patent: Jan. 26, 2010

(54) CARRIER TRAY FOR USE WITH PROBER

(75) Inventors: Satoshi Tomita, Kasugai (JP); Hiroyuki Tokuyama, Kasugai (JP)

(73) Assignee: Fujitsu Microelectronics Limited, Tokyo (JP)

( * ) Notice: Subject to any disclaimer, the term of this patent is extended or adjusted under 35 U.S.C. 154(b) by 221 days.

(21) Appl. No.: 11/836,327

(22) Filed: Aug. 9, 2007

(65) Prior Publication Data
US 2008/0036482 A1 Feb. 14, 2008

(30) Foreign Application Priority Data
Aug. 9, 2006 (JP) .............................. 2006-216579

(51) Int. Cl.
*G01R 31/02* (2006.01)
(52) U.S. Cl. ..................... 324/158.1; 324/755; 324/765
(58) Field of Classification Search ....................... None
See application file for complete search history.

(56) References Cited
U.S. PATENT DOCUMENTS
5,456,360 A * 10/1995 Griffin ......................... 206/443

FOREIGN PATENT DOCUMENTS
| JP | 2-010752 A | 1/1990 |
| JP | 8-179007 A | 7/1996 |
| JP | 2001-113420 A | 4/2001 |
| JP | 2004-160627 A | 6/2004 |

* cited by examiner

*Primary Examiner*—Minh N Tang
(74) *Attorney, Agent, or Firm*—Westerman, Hattori, Daniels & Adrian, LLP

(57) ABSTRACT

A carrier tray for use with a prober is arranged to allow the prober to measure or test not only semiconductor wafers but also semiconductor packages and accurately position each of different-shaped semiconductor packages. A carrier tray 1 includes a lowermost tray 10 and an uppermost tray 20 interposing therebetween an intermediate tray 30. The lowermost and uppermost trays 10 and 20 are each of a circular shape having a diameter D1. A diameter D3 of the intermediate tray 30 is smaller than the diameter D1. The intermediate tray 30 is centrally formed with a screw hole portion 32 in which a locking spacer screw 22 is screwed. A semiconductor package 40 is to be placed in a package holding pocket 11. With the locking spacer screw 22, the intermediate 30 is slidable in an X and Y directions, so that the X and Y coordinates of the semiconductor package 40 are determined uniquely relative to the carrier tray 1.

8 Claims, 18 Drawing Sheets

ASSEMBLING VIEW OF CARRIER TRAY 1 OF FIRST EMBODIMENT

FIG.1 EXPLODED VIEW OF CARRIER TRAY 1 OF FIRST EMBODIMENT

FIG.3 SECTION VIEW OF CARRIER TRAY 1 OF FIRST EMBODIMENT

PARTIAL ENLARGED TOP VIEW (NO. 1) OF CARRIER TRAY 1 OF FIRST EMBODIMENT

PARTIAL ENLARGED TOP VIEW (NO. 2) OF CARRIER TRAY 1 OF FIRST EMBODIMENT

PARTIAL ENLARGED TOP VIEW (NO. 1) OF CARRIER TRAY 1A OF SECOND EMBODIMENT

PARTIAL ENLARGED TOP VIEW (NO. 2) OF CARRIER TRAY 1A OF SECOND EMBODIMENT

PARTIAL ENLARGED TOP VIEW (NO. 3) OF CARRIER TRAY 1A OF SECOND EMBODIMENT

TOP VIEW OF CARRIER TRAY 1C OF THIRD EMBODIMENT

PARTIAL SECTION VIEW OF CARRIER TRAY 1C
OF THIRD EMBODIMENT

TOP VIEW AND SECTION VIEW OF CARRIER TRAY 1C OF THIRD EMBODIMENT

TOP VIEW AND SECTION VIEW OF CARRIER TRAY 1D OF FOURTH EMBODIMENT

EXPLODED VIEW SHOWING POSITIONING DEVICE 180 IN RELATED ART

PARTIAL SECTION VIEW OF PLATE-LIKE SUBSTRATE 203
IN RELATED ART

FIG.16 EXPLODED VIEW OF CARRIER TRAY 1E

PARTIAL ENLARGED TOP VIEW (NO. 1) OF CARRIER TRAY 1E

PARTIAL ENLARGED TOP VIEW (NO. 2) OF CARRIER TRAY 1E

CARRIER TRAY FOR USE WITH PROBER

CROSS-REFERENCE TO RELATED APPLICATIONS

This application is based upon and claims the benefit of priority from the prior Japanese Patent Application No. 2006-216579 filed on Aug. 9, 2006, the entire contents of which are incorporated herein by reference.

BACKGROUND

1. Field

The present embodiment relates to a carrier tray for use with a prober (a proving machine) for testing semiconductor wafers and semiconductor package and particularly to a carrier tray for use with a prober, capable of readily positioning semiconductor packages to be placed in the carrier tray.

2. Description of Related Art

A test device disclosed in Japanese unexamined patent publication No 02(1990)-010752 requires previous replacement of a unit part such as a probe card according to whether an object to be tested (a test object) is a semiconductor wafer or a packaged product. Semiconductor devices formed in each semiconductor wafer and the packaged products placed in each tray can be tested by a single test device.

FIG. 14 shows a positioning device 180 disclosed in Japanese unexamined patent publication No. 2004-160627, which comprises a lower plate 181 and an upper plate 190 which slidably overlap one another. The lower plate 181 and the upper plate 190 are formed with square open windows 182 and 191 arranged in a matrix, respectively, so that the open windows 182 and 191 overlap in a one-to-one correspondence, thereby forming each opening in which a cap body 152 can be placed. When the cap bodies 152 are individually placed in the openings, the lower plate 181 and the upper plate 190 are slid in opposite directions Y1 and Y2. Thus, the edge of each open window 182 and the edge of each open window 191 clamp each cap body 152 to position it in place.

FIG. 15 shows a plate-like substrate 203 disclosed in Japanese unexamined patent publication No. 8 (1996)-179007. The plate-like substrate 203 is formed with concentric holding recesses 202 different in outer size and depth each configured to hold an IC device 204 to be tested.

It is to be noted that a related art to the above devices is disclosed in Japanese unexamined patent publication No. 2001-113420.

BRIEF SUMMARY

The present embodiment provides a carrier tray for a semiconductor package, which is used in a test of the semiconductor package by a prober for testing a semiconductor wafer, the carrier tray including a first tray provided with a plurality of rectangular holding parts arranged in a matrix, each of which has a depth smaller than thickness of the semiconductor package and is configured to hold the semiconductor package, a second tray provided with a plurality of first windows arranged in correspondence with the plurality of rectangular holding parts, each first window being of a rectangular shape to surround each semiconductor package, and the second tray being placed in contact with the first tray, wherein the first and second trays are slidable relative to each other, one of the first and second trays is of an outer diameter equal to an outer diameter of the semiconductor wafer to be handled by the prober and an outer edge of the other tray stays within a range corresponding to an outer edge of one of the first and second trays during sliding.

BRIEF DESCRIPTION OF THE DRAWINGS

The accompanying drawings, which are incorporated in and constitute a part of this specification illustrate an embodiment and, together with the description, serve to explain the objects, advantages and principles of the invention.

In the drawings.

DETAILED DESCRIPTION OF THE PREFERRED EMBODIMENTS

Figure 1:
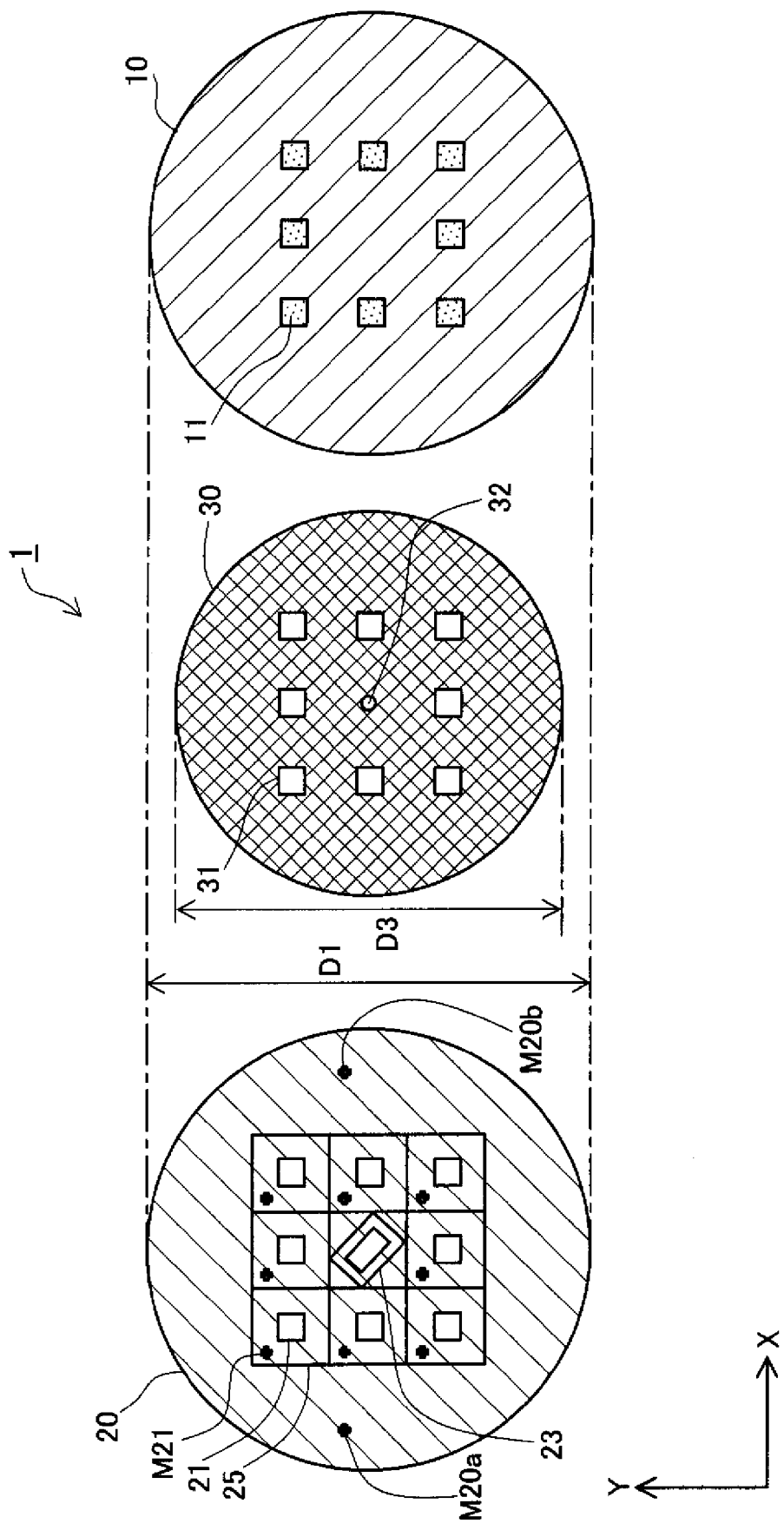
FIG. 1 is an exploded view of a carrier tray 1 of a first embodiment.

A detailed description of preferred embodiments of a carrier tray for use with a prober, embodying the present embodiment will now be given referring to FIGS. 1 to 13.

A first embodiment will be described referring to FIGS. 1 to 5. A carrier tray 1 of the first embodiment will be explained referring to FIG. 1. The carrier tray 1 comprises a lowermost tray 10, an uppermost tray 20, and an intermediate tray 30. The carrier tray 1 is made of aluminum. The lowermost tray 10 is of a circular shape having a diameter D1. This lowermost tray 10 is formed with a plurality of package holding pockets 11 arranged in a matrix. Each package holding pocket 11 is of a rectangular recessed shape to hold various types of semiconductor packages.

The intermediate tray 30 is of a circular shape having a diameter D3 smaller than the diameter D1 of the lowermost tray 10. This intermediate tray 30 is formed with first windows 31 arranged in a matrix to match the package holding pockets 11 in number and location. Each first window 31 is almost equal in size to each package holding pocket 11. The intermediate tray 30 is centrally provided with a screw hole portion 32 in which a locking spacer screw (hereinafter, a "spacer screw") 22 is screwed as will be mentioned later.

The uppermost tray 20 is of a circular shape having a diameter D1. This uppermost tray 20 is formed with a plurality of measuring windows 21 arranged in a matrix to match the package holding pockets 11 in number and location. Each measuring window 21 is equal in size to each package holding pocket 11. Further, the uppermost tray 20 is provided with an opening 23 for slide lever (hereinafter, a "slide-lever opening") in a location corresponding to the screw hole portion 32 so that the screw hole portion 32 protrudes through the slide-lever opening 23 as mentioned later.

On the peripheral region of the uppermost tray 20, there are provided alignment marks M20a and M20b for alignment of the carrier tray 1. These alignment marks M20a and M20b may be provided in a columnar shape like a pin or post with a predetermined height vertical to the uppermost tray 20. An alignment mark M21 is further provided near each of the measuring windows 21. The alignment marks M20a and M20b serve as a reference point of position coordinates of the carrier tray 1 and also a reference point for parallel adjustment with the X- or Y-axis of the prober during rough alignment. On the other hand, the alignment marks M21 are used for fine alignment.

The uppermost tray 20 is also provided, around each measuring window 21, with scribe lines 25 for parallel adjustment as with scribe lines of the semiconductor wafer. By the scribe lines 25, the measuring windows 21 are bordered in a grid pattern and divided in index size. The scribe lines 25 may be convex or concave in section. Forming the scribe lines and index-sizing are preferably made with reference to the center of the circular uppermost tray 20 to facilitate understanding of a positional relation of the alignment marks and a positional relation of packages (a distance from the center and a coordinate).

Figure 2:
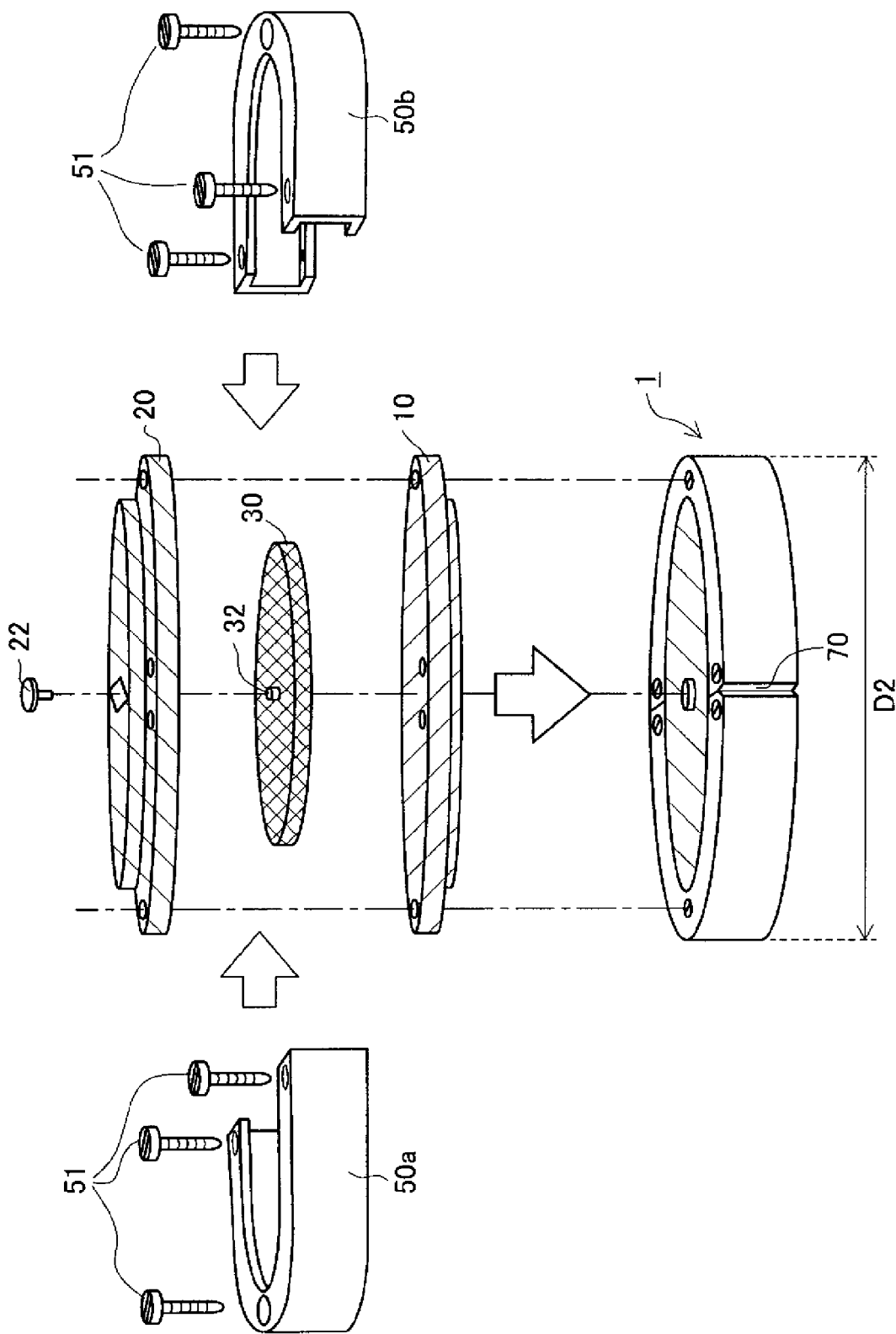
FIG. 2 is an assembling view of the carrier tray 1 of the first embodiment.

The carrier tray 1 is arranged so that the intermediate tray 30 is sandwiched between the lowermost tray 10 and the uppermost tray 20 as shown in FIG. 2. The lowermost tray 10 and the uppermost tray 20 are fixed to each other by retaining frames 50a and 50b with screws 51. Thus the assembly of the carrier tray 1 is completed. The spacer screw 22 is screwed in the screw hole portion 32 of the intermediate tray 30. The diameter D2 of the carrier tray 1 is determined to be equal to the diameter of a semiconductor wafer which is handled in the prober. The retaining frames 50a and 50b are formed with a notch 70 used for the parallel adjustment as with the semiconductor wafer. The notch 70, which serves as a reference point for the parallel adjustment of the carrier tray 1 during the rough alignment. Instead of the notch 70, of course, the retaining frames 50a and 50b may be provided with an orientation flat.

Figure 3:
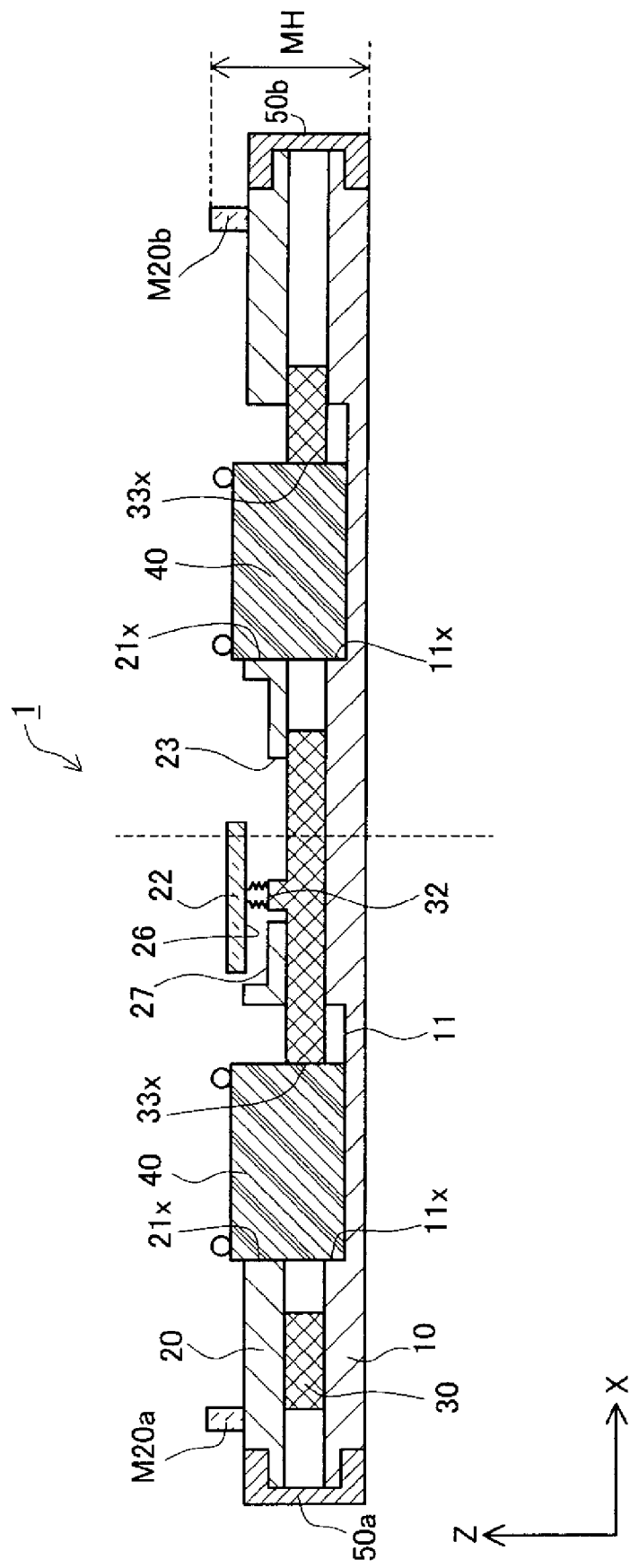
FIG. 3 is a section view of the carrier tray 1 of the first embodiment.

FIG. 3 is a section view of the carrier tray 1. As an example, the case where a semiconductor package 40 is a Ball Grid Array (BGA) type package will be explained below. Each package holding pocket 11 has a depth smaller than the thickness of the semiconductor package 40. Accordingly, the semiconductor package 40 protrudes outside the package holding pocket 11 in a Z direction (upward in the figure). The protruding part of the semiconductor package 40 is surrounded by the internal surfaces of the first window 31 of the intermediate tray 30 and the measuring window 21 of the uppermost tray 20.

The slide-lever opening 23 provided in the location corresponding to the screw hole portion 32 allows the screw hole portion 32 to protrude outside therethrough. The slide-lever opening 23 is designed to have a width larger than the diameter of the screw hole portion 32. The intermediate tray 30 is thus slidable freely in both X and Y directions in a range that the screw hole portion 32 stays within the slide-lever opening 23. Namely, the intermediate tray 30 is in a so-called floating state. The spacer screw 22 is screwed in the screw hole portion 32.

First, the spacer screw 22 serves as a slide lever. Specifically, when loosened, the spacer screw 22 is made to protrude upward. The spacer screw 22 in this position allows sliding movement of the intermediate tray 30 when horizontal force is applied to the spacer screw 22.

The spacer screw 22 secondly serves to fix the intermediate tray 30. Specifically, when tightened, the spacer screw 22 moves down until its lower surface 26 comes into contact with an upper surface around the slide lever opening 23, thereby securing the intermediate tray 30 to the uppermost tray 20. This makes it possible to lock the intermediate tray 30 against movement even during transfer of the carrier tray 1 or a test of the semiconductor packages 40, so that the test can be conducted more accurately.

The alignment marks M20a and M20b are provided in the columnar shape like a pin or post standing on the uppermost tray 20. Here, the height MH from a lower surface of the carrier tray 1 to the top of each alignment mark M20a, M20b represents the maximum thickness of the tray 1. Accordingly, the alignment marks M20a and M20b may also be used as marks for inspecting the limit of tray thickness. This makes it possible to e.g. make a check on the tray thickness prior to the transfer of tray by the prober, whereby enabling fail safe to prevent damages to probe pins and devices.

Figure 4:
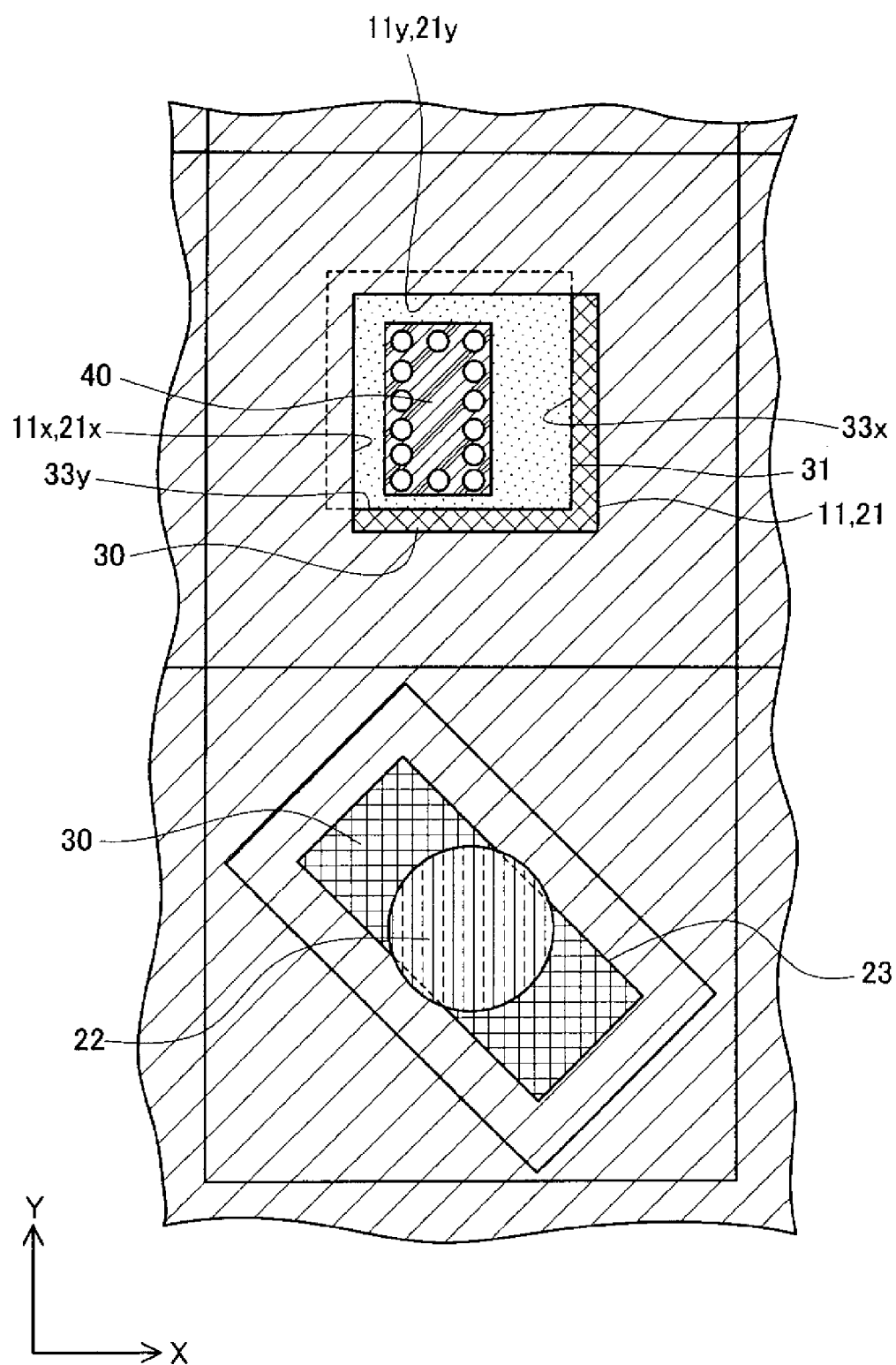
FIG. 4 is a partial enlarged top view (No. 1) of the carrier tray 1 of the first embodiment.
Figure 5:
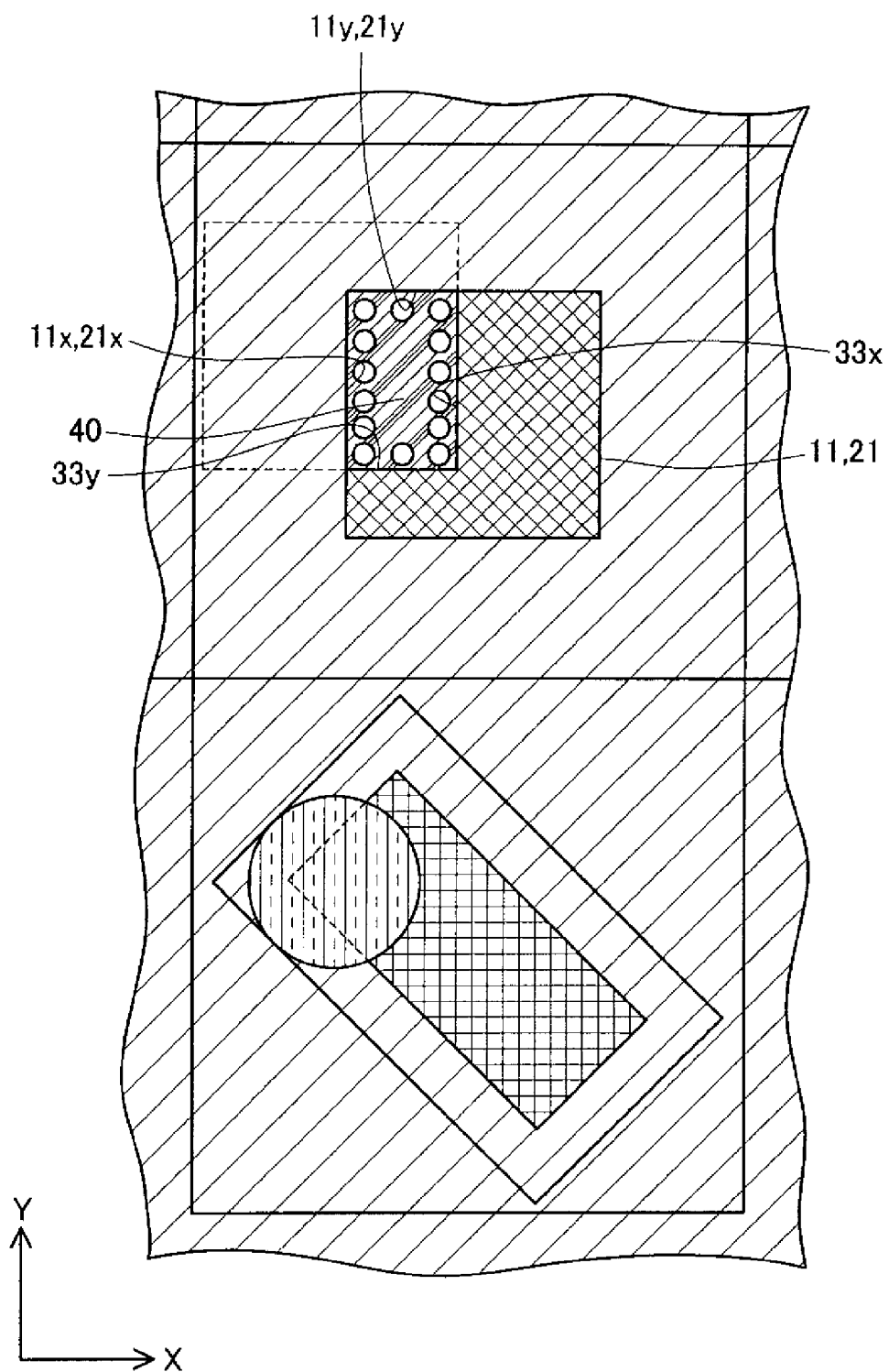
FIG. 5 is a partial enlarged top view (No. 2) of the carrier tray 1 of the first embodiment.
Figure 6:
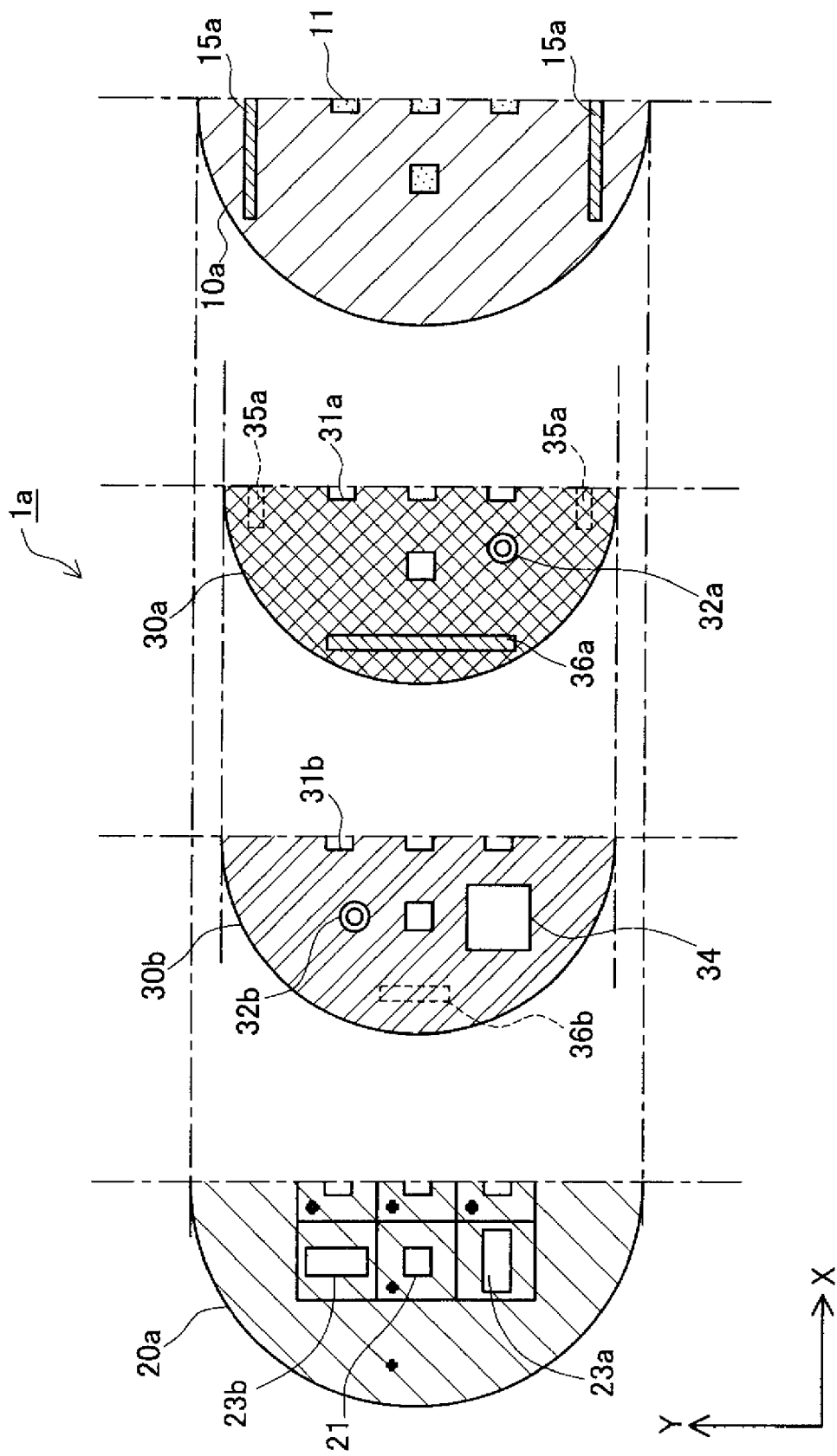
FIG. 6 is an exploded view of a carrier tray 1a of a second embodiment.

The operation of the carrier tray 1 arranged as above is explained with reference to FIGS. 4 and 5, which are partial enlarged top views of the carrier tray 1, showing the measuring window 21 and the slide-lever opening 23. The semiconductor package 40 is first put in the package holding pocket 11 by a robot or a hand (automatically or manually) (FIG. 4). The opening formed by overlapping of the package holding pocket 11 and the measuring window 21 and the first window 31 is larger in size in the X and Y directions than the semiconductor package 40, thus generating a clearance between (the internal surfaces of) the opening and the semiconductor package 40.

The positioning of the semiconductor package 40 is then made by use of the intermediate tray 30. By moving the space screw 22, the intermediate tray 30 is slid upper-leftward in the figure along the slide-lever opening 23. The semiconductor package 40 is clamped and positioned in the X direction by an edge 33x of the first window 31 and an edge 11x of the package holding pocket 11 and an edge 21x of the measuring window 21. Similarly, the semiconductor package 40 is clamped and positioned in the Y-direction by an edge 33y of the first window 31 and an edge 11y of the package holding pocket 11 and an edge 21y of the measuring window 21. As shown in FIGS. 3 and 5, accordingly, the semiconductor package 40 is disposed in an upper left corner in contact with the X-direction edges 11x and 21x and the Y-direction edges 11y and 21y of the package holding pocket 11 and the measuring window 21. Consequently, positioning of the semiconductor package 40 in the X and Y coordinates is uniquely conducted relative to the carrier tray 1.

After completion of positioning of the semiconductor package 40, locking of the position of the intermediate tray 30 is conducted by use of the spacer screw 22. As shown in FIG. 3, specifically, the spacer screw 22, having a lower threaded portion, is turned until the lower surface 26 of the spacer screw 22 comes into contact with the upper surface 27 around the slide-lever opening 23 of the uppermost tray 20, thereby securing the intermediate tray 30 to the uppermost tray 20. This makes it possible to prevent displacement of the semiconductor package 40 even during transfer of the carrier tray 1, a test of the semiconductor package 40, and others. Thus, the test can be conducted more accurately.

After completion of positioning and locking of the semiconductor package 40 in the carrier tray 1, a test process is conducted as below.

(1) An appropriate probe card of the prober is selected according to a test object. When a test of semiconductor packages is to be conducted, for example, a probe card installing a socket using a pogo pin is selected. When a test of semiconductor wafers is to be conducted, on the other hand, a cantilever probe card is selected for example.

(2) A cassette in which the carrier tray 1 is housed is set in the prober.

(3) Prior to transfer of the carrier tray 1 (to a testing stage), checks are made on the thickness of the carrier tray 1, whether the semiconductor package 40 is inclined, whether the tray thickness exceeds a maximum limit due to inclination of the semiconductor package 40, and so on.

(4) The carrier tray 1 housed in the cassette is then taken out by a robot arm onto a testing stage of the prober.

(5) The alignment of the carrier tray 1 is performed by reading the alignment marks of the carrier tray 1. Accordingly, the carrier tray 1 is moved to a position defined by predetermined coordinates. As needed, the carrier tray 1 is adjusted in parallel with the X- or Y-axis of the prober by the scribe lines.

(6) Pogo pins for input/output of signals are brought in contact with signal terminals of the semiconductor package 40 in the carrier tray 1 for conducting an electric performance test such as a predetermined operation check. When necessary, fine alignment is carried out for each semiconductor package 40 by using the alignment mark M21 provided in each measuring window 21.

(7) After the test is completed on all the semiconductor packages 40 placed in the carrier tray 1, the carrier tray 1 is brought back to the cassette. Thus, the test is terminated.

(8) The above steps (3) through (7) are repeated for each of other untested carrier trays 1, if any, in the cassette.

As explained above in detail, according to the carrier tray for use with the prober in the first embodiment, the X and Y coordinates of the semiconductor package 40 relative to the carrier tray 1 can be determined uniquely by sliding the intermediate tray 30. Accordingly, the semiconductor package 40 can readily be positioned in place by a simple operation of the spacer screw 22.

The carrier tray 1 is arranged to allow changes of the shape of the opening formed by the overlapping package holding pocket 11, measuring window 21, and first window 31. Thus, the carrier tray 1 has no limitation on the shape of a semiconductor package to be placed therein and therefore has high adaptability to different-shaped semiconductor packages. This requires no specific tray for each package, achieving a reduction in testing costs and an increase in throughput.

The diameter D2 of the carrier tray 1 is set to be equal to the diameter of the semiconductor wafer to be handled by the prober. The intermediate tray 30 is allowed to slide so that the outer edge of the intermediate tray 30 stays within the range corresponding to the outer edges of the lowermost tray 10 and the uppermost tray 20. This sliding operation will not cause any change in the outer shape of the carrier tray 1. The carrier tray 1 can thus be handled as with the semiconductor wafer. Consequently, the prober for testing semiconductor wafers can also test the semiconductor package(s), without needing any modification or remodeling of the prober.

In the carrier tray 1, the position of the semiconductor package 40 can be fixed by the spacer screw 22. For example, differently, if a resilient member such as a spring is used to fix the semiconductor package 40, the resilient member, which tends to deteriorate, may not stably fix the semiconductor package 40 over the long term. Further, the amount of deformation of such resilient member depends on the size of the semiconductor package 40. Accordingly, the semiconductor package 40 could not be fixedly held by uniform clamping force irrespective of the size of the semiconductor package 40. In the present embodiment, however, the spacer screw 22, not the resilient member, is used to fix the semiconductor package 40, which can be fixedly held stably over the long term. In addition, the clamping force for fixing can be controlled to a uniform value. In particular, for a semiconductor package with lead wires extending from the sides of a molded part, it is necessary to control the clamping force to be applied to the lead wires through the opening in order to prevent deformation of the lead wires. Thus, the spacer screw 22 is also preferably used to fix such type of semiconductor package.

Further, the carrier tray 1 comprises the uppermost tray 20 placed on and in contact with the intermediate tray 30. These uppermost tray 20 and intermediate tray 30 are secured by the spacer screw 22. This makes it possible to prevent displacement of the semiconductor package 40 even during transfer of the carrier tray 1, a test of the semiconductor package 40, and others. The test can thus be carried out more accurately.

The uppermost tray 20 is provided with the alignment marks M20a and M20b identical to those of the semiconductor wafer and also the scribe lines 25 for parallel adjustment with the X- or Y-axis of the prober, around each measuring window, similar to the scribe lines of the semiconductor wafer. Accordingly, the prober can handle the carrier tray 1 as well as the semiconductor wafer without needing special modifications.

A carrier tray 1a of a second embodiment will be explained below referring to FIGS. 6 to 9. The carrier tray 1a comprises a lowermost tray 10a, an uppermost tray 20a, an X-direction intermediate tray 30a, and a Y-direction intermediate tray 30b. The X-direction intermediate tray 30a is formed with X-direction windows 31a arranged in a matrix to match package holding pockets 11 in number and location. The X-direction intermediate tray 30a is formed with a screw hole portion 32a in which a locking spacer screw (hereinafter, a "spacer screw") 22a is screwed as will be mentioned later. On the other hand, the Y-direction intermediate tray 30b is similarly formed with Y-direction windows 31b arranged in a matrix to match the package holding pockets 11 in number and location. This Y-direction intermediate tray 30b is formed with a screw hole portion 32b in which a locking spacer screw (hereinafter, a "spacer screw") 22b is screwed as will be mentioned later, and also a slide-lever opening 34 through which the screw hole portion 32a is inserted.

The X-direction intermediate tray 30a is formed with raised portions 35a extending in the X direction on a lower surface. The lowermost tray 10a is provided with recesses 15a which engage with the raised portions 35a. The X-direction intermediate tray 30a is thus allowed to slide only in the X direction relative to the lowermost tray 10a. Similarly, the Y-direction intermediate tray 30b is formed with raised portions 36b extending in the Y direction from a lower surface. The x-direction intermediate tray 30a is provided, on its upper surface, with recesses 36a which engage with the raised portions 36b. The Y-direction intermediate tray 30b is thus allowed to slide only in the Y direction relative to the X-direction intermediate tray 30a.

Owing to engagement between the above raised portions and the recesses, the trays can be held in contact with each other with small contact areas and hence produce only low frictional force in sliding. Consequently, the sliding operation requires only small force. Since the trays can be held in line contact, not surface contact, with each other, the accuracy of positioning of those trays in sliding can be more enhanced. It should be understood that the raised portions and the recesses may be formed in any section; e.g. a triangular cross-section rail, a V-shaped cross-section groove, and a semicircular cross-section rail or groove. Furthermore, the height of each raised portion may be adjusted to control the distance (clearance) between the overlapping trays and the thickness of the carrier tray 1a.

The uppermost tray 20a is provided with slide-lever openings 23a and 23b for the screw hole portions 32a and 32b respectively. In the screw hole portions 32a and 32b, locking spacer screws (hereinafter, "spacer screws") 22a and 22b are screwed respectively. Other structures are identical to those of the carrier tray 1 of the first embodiment and therefore their detailed explanations are not repeated below.

Figure 7:
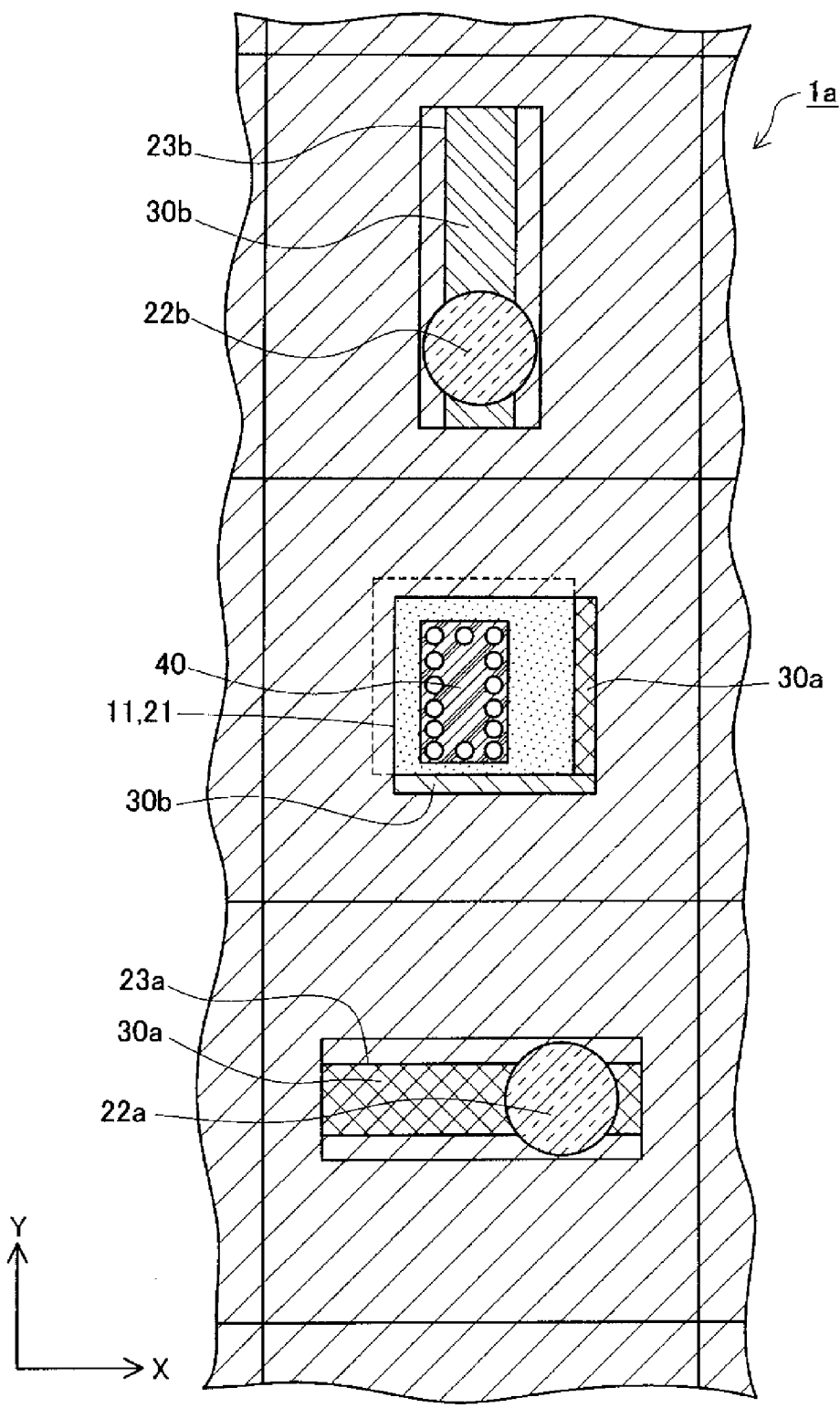
FIG. 7 is a partial enlarged top view (No. 1) of the carrier tray 1a of the second embodiment.
Figure 8:
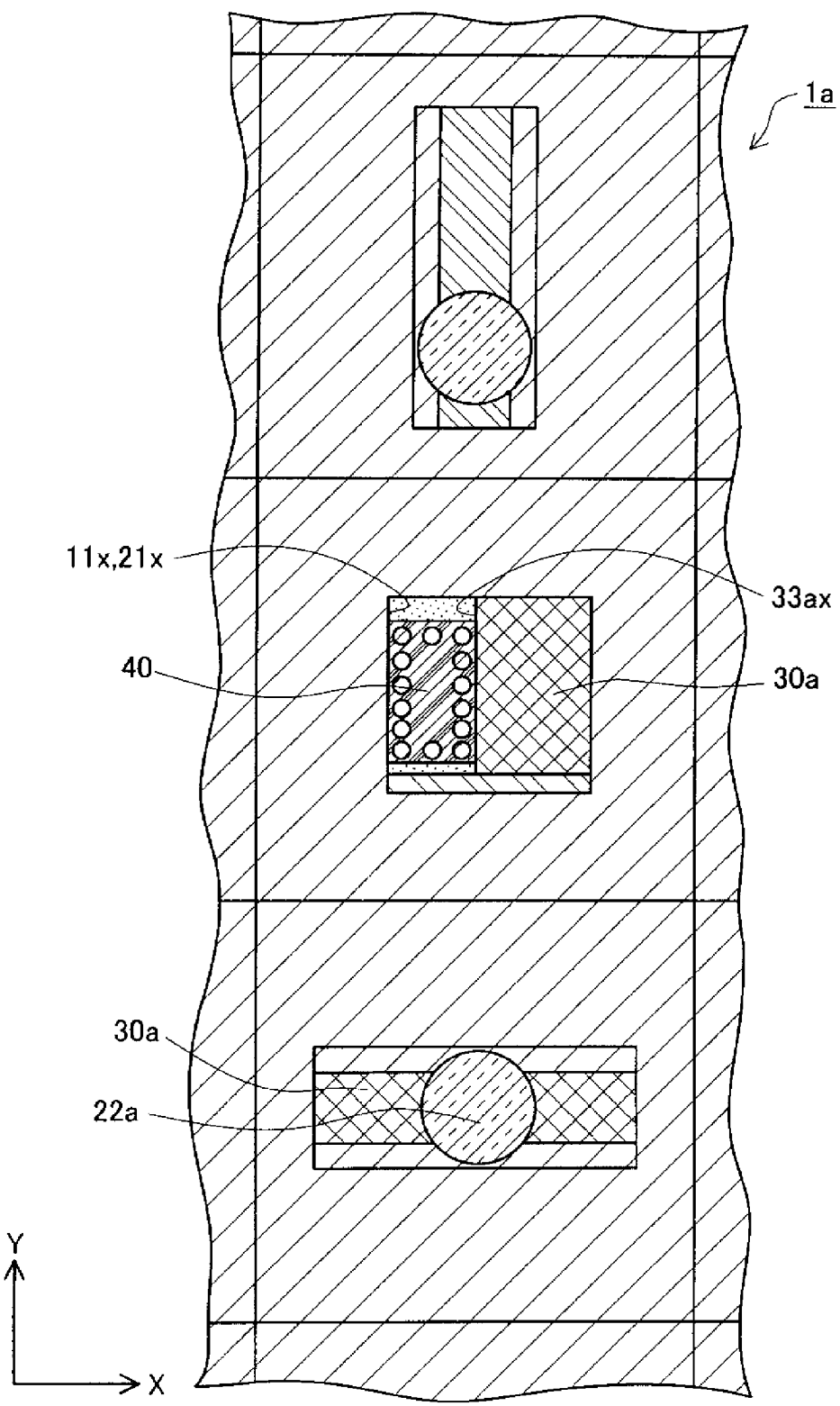
FIG. 8 is a partial enlarged top view (No. 2) of the carrier tray 1a of the second embodiment.
Figure 9:
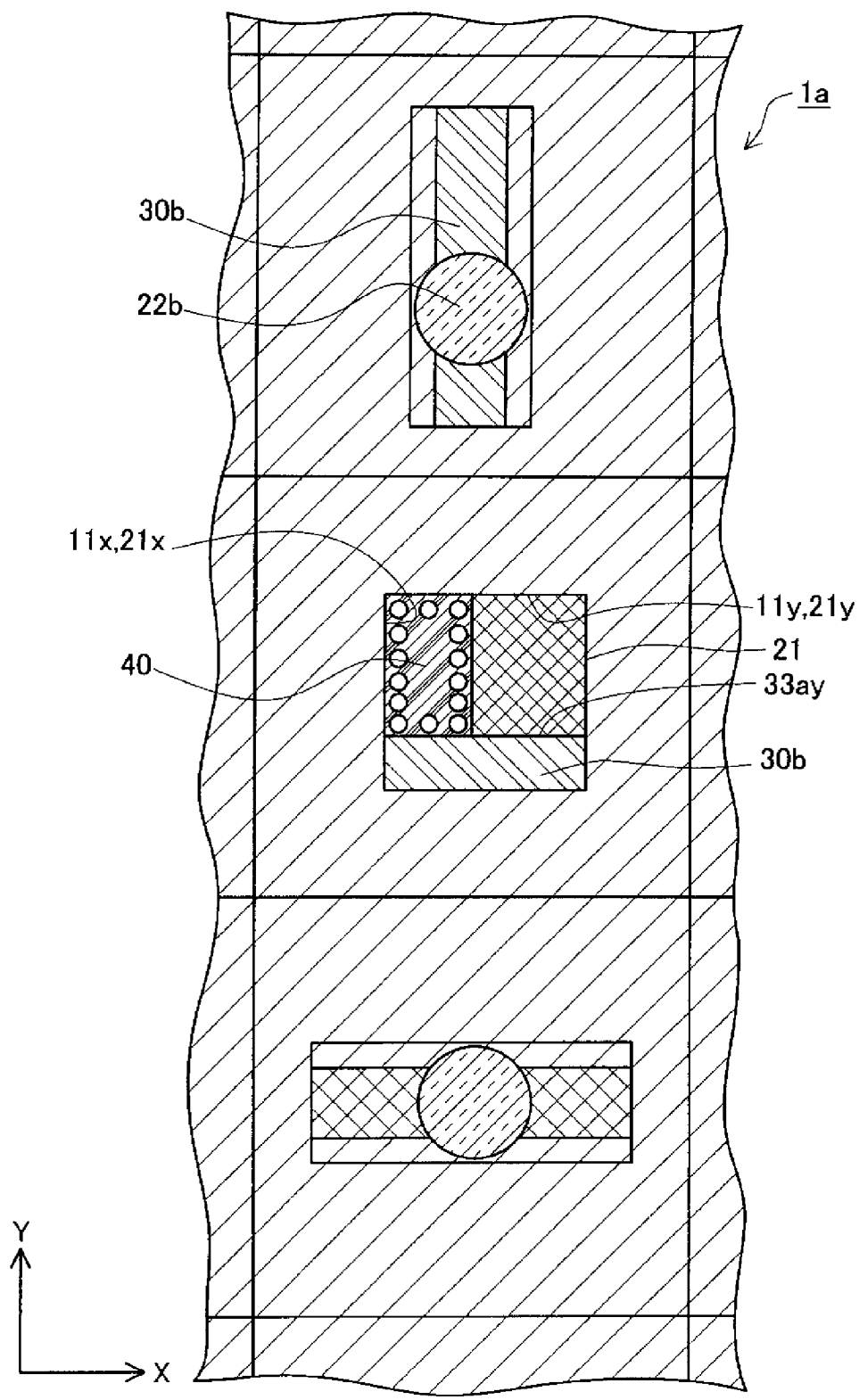
FIG. 9 is a partial enlarged top view (No. 3) of the carrier tray 1a of the second embodiment.

The operation of the carrier tray 1a is explained referring to FIGS. 7 to 9 which are partial enlarged top views of the carrier tray 1a, showing the measuring window 21 and the slide-lever openings 23a and 23b. As shown in FIG. 7, the semiconductor package 40 is placed in the package holding pocket 11. Using the X-direction intermediate tray 30a, positioning the semiconductor package 40 in the X direction is first conducted. The X-direction intermediate tray 30a is slid in the X direction (leftward in the figure) by moving the spacer screw 22a to narrow the opening area in the X direction, as shown in FIG. 8. The semiconductor package 40 is then clamped and positioned in the X direction by an edge 33ax of the X-direction window 31a in cooperation with the edge 11x of the package holding pocket 11 and the edge 21x of the measuring window 21. Similarly, the Y-direction intermediate tray 30b is slid in the Y direction (upward in the figure) by moving the spacer screw 22b to narrow the opening area in the Y direction, as shown in FIG. 9. The semiconductor package 40 is then clamped and positioned in the Y direction by the edge 33ay of the Y-direction window 31b in cooperation with the edge 11y of the package holding pocket 11 and the edge 21y of the measuring window 21.

As above, the semiconductor package 40, supported in contact with the X-direction edges 11x and 21x and the Y-direction edges 11y and 21y of the package holding pocket 11 and the measuring window 21, is positioned in an upper left corner of the measuring window 21 as shown in FIG. 9. Consequently, positioning of the semiconductor package 40 in the X and Y coordinates is uniquely conducted relative to the carrier tray 1a.

As explained above in detail, according to the carrier tray for use with the prober in the second embodiment, the X coordinate of the semiconductor package 40 relative to the carrier tray 1a can be fixed uniquely by sliding the X-direction intermediate tray 30a. Further, the Y coordinate of the semiconductor package 40 relative to the carrier tray 1a can also be fixed uniquely by sliding the Y-direction intermediate tray 30b. Accordingly, the semiconductor package 40 can readily be positioned in place by simple operations of the spacer screws 22a and 22b.

Figure 10:
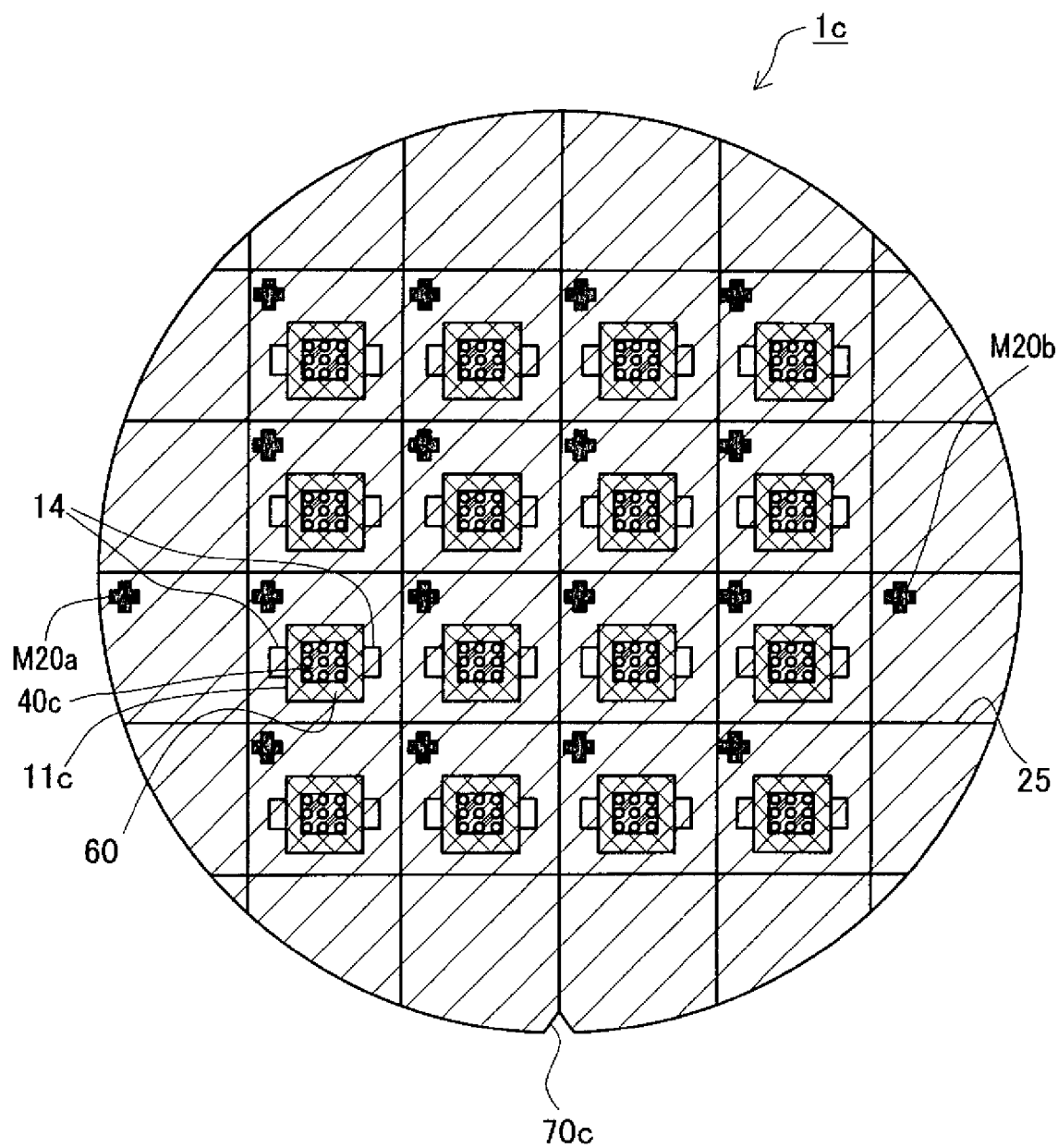
FIG. 10 is a top view of a carrier tray 1c of a third embodiment.

A third embodiment will be explained below referring to FIGS. 10 to 12. A carrier tray 1c of the third embodiment is explained referring to FIG. 10 showing a top view thereof. The following explanation shows an example in which the carrier tray 1c holds semiconductor packages 40 of the BGA type with no lead wire protruding from the sides of a molded part. The carrier tray 1c is provided with rectangular package holding pockets 11c arranged in a matrix, each of which is shaped in recess form. The carrier tray 1c is also provided with alignment marks M20a and M20b, scribe lines 25, and a notch 70c. In each package holding pocket 11c, set is a package positioning bush 60 having a shape determined according to the shape of semiconductor package 40c to fill a clearance between the package holding pocket 11c and the semiconductor package 40c. Each positioning bush 60 is made of an insulating material.

Figure 11:
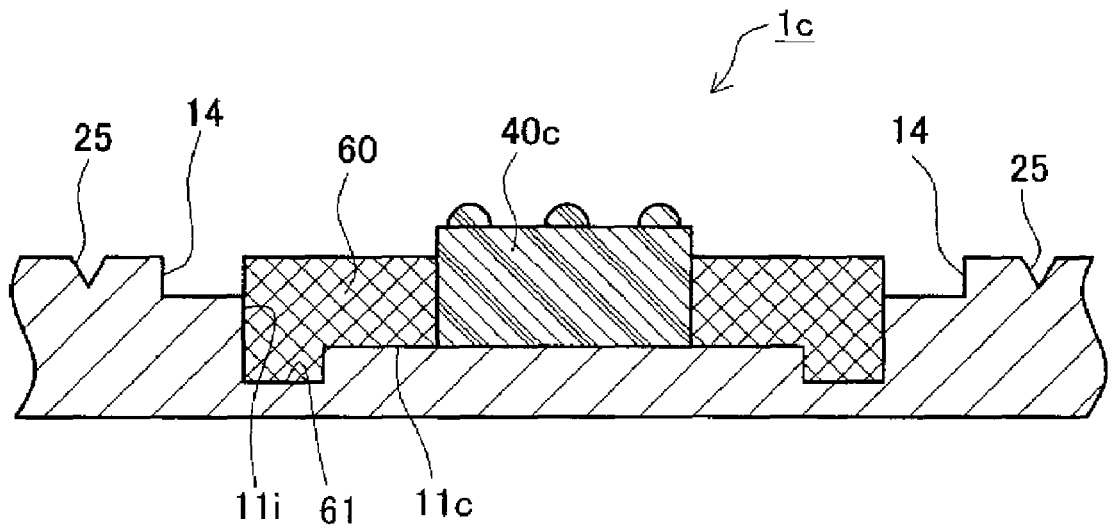
FIG. 11 is a partial section view of the carrier tray 1c of the third embodiment.

FIG. 11 is a partial section view of the carrier tray 1c. The package holding pocket 11c is formed with a groove 61 for fixing the positioning bush 60. The downward protrusion of the positioning bush 60 engages in the groove 61 to fix the positioning bush 60 in the package holding pocket 11c. This pocket 11c is further provided with recessed clearances 14 for facilitating insertion/removal of the semiconductor package 40c.

The operation of the carrier tray 1c is explained below. In each package holding pocket 11c, the semiconductor package 40c is placed with its ball terminals facing upward. The semiconductor package 40c is smaller in size than the package holding pocket 11c, thus generating a clearance between inner wall surfaces 11i of the package holding pocket 11c and the semiconductor package 40c. Accordingly, the positioning bush 60 fills the clearance between the internal wall surfaces 11i of the package holding pocket 11c and the semiconductor package 40c. This uniquely fixes the X and Y coordinates of the semiconductor package 40c relative to the carrier tray 1c.

Figure 12:
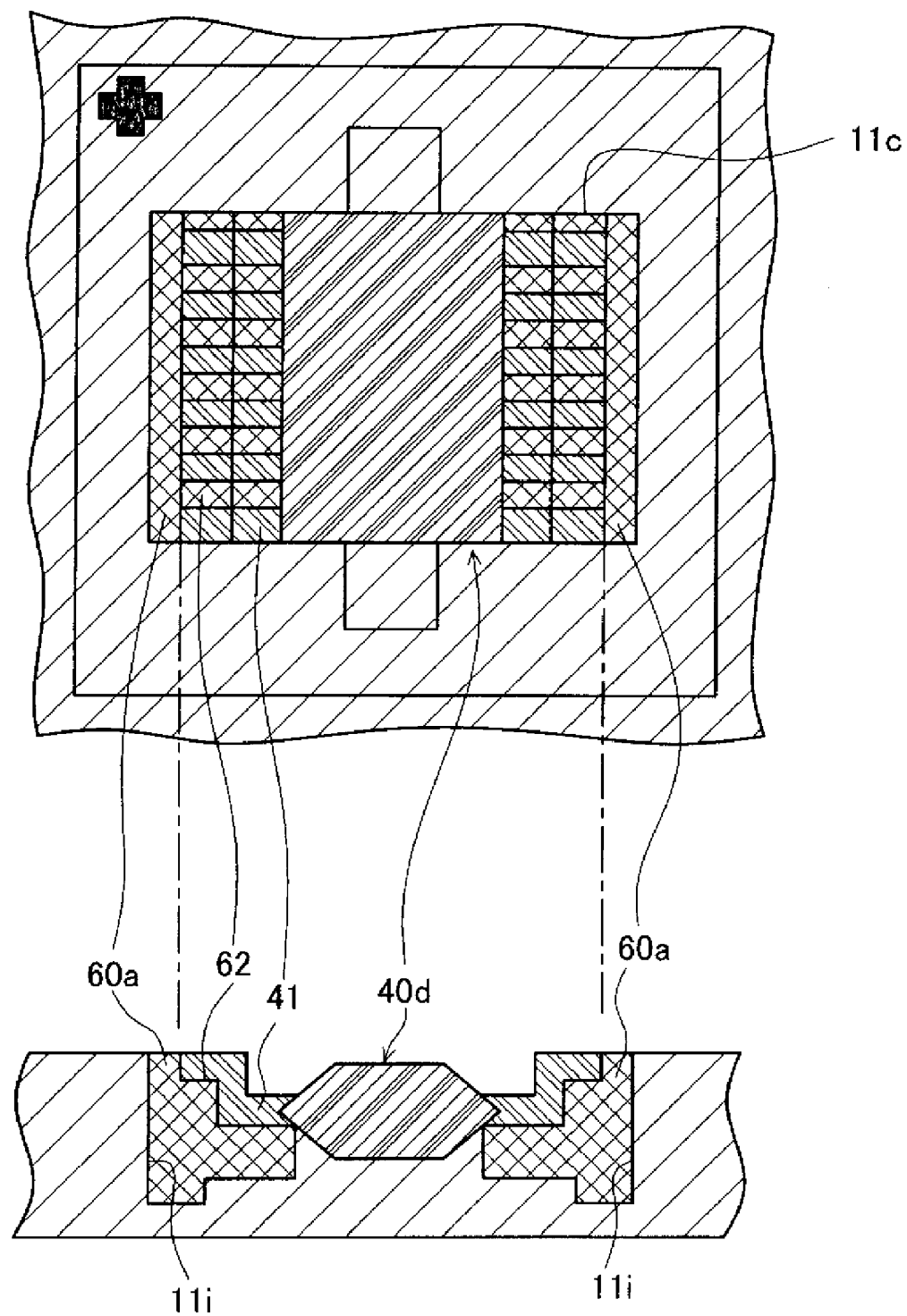
FIG. 12 is a top view and a section view of the carrier tray 1c of the third embodiment.

FIG. 12 shows another example in which the carrier tray 1c holds a semiconductor package 40d provided with lead wires 41 horizontally extending from a molded part. Each of positioning bushes 60a is provided with a support portion 62 which supports the lead wires 41 in surface contact relation to hold the semiconductor package 40d. The positioning bush 60a is made of an insulating material in consideration of contact with the lead wires.

The positioning bushes 60a fill the clearances between the lead wires 41 and the internal wall surfaces 11i of the package holding pocket 11c. Thus, the X and Y coordinates of the semiconductor package 40d are uniquely fixed relative to the carrier tray 1c. Since the lead wires 41 are supported by the support portions 62, the lead wires 41 can be prevented from becoming deformed in case a pogo pin touches the lead wires 41 during a test.

As explained above in detail, according to the carrier tray 1c of the third embodiment, the positioning bush 60 fills the clearances between the internal wall surface 11i of the package holding pocket 11c and the semiconductor package 40c. Alternatively, the positioning bushes 60a fill the clearances between the internal wall surfaces 11i and the lead wires 41. Thus, the X and Y coordinates of the semiconductor package can be determined uniquely relative to the carrier tray 1c.

Further, the carrier tray 1c according to the present embodiment includes the positioning member designed to match the shape of a semiconductor package. Therefore the carrier tray 1c has no limitation on the shape of a semiconductor package to be placed therein and can handle any semiconductor packages of different shapes, achieving a reduction in testing costs and an increase in throughput. By using various types of positioning members, a single carrier tray 1 can hold different-shaped semiconductor packages. This enables a test on semiconductor packages in many different kinds and in small batches.

The outer diameter of the carrier tray 1c is set to be equal to that of the semiconductor wafer to be handled in the prober. It is therefore possible to carry out a test of semiconductor packages by using the prober for testing semiconductor wafers, without needing any modification or remodeling of the prober. Further, the carrier tray 1c can be composed of a single tray, which can achieve a reduction in thickness of the carrier tray.

Even where no groove 61 is provided, the positioning bush 60 can be fixed in the package holding pocket 11c if only the positioning bush 60 is designed to have contact surfaces which can be brought in contact with four internal wall surfaces 11i of the package holding pocket 11c. For instance, the positioning bush 60 shaped in a rectangular frame form as shown in FIG. 10 has contact surfaces which can be brought in contact with the four internal wall surfaces of the package holding pocket 11c, so that the positioning bush 60 can be fixed. The positioning bush 60 may be composed of a pair of L-shaped (in top view) components, providing contact surfaces which can be brought in contact with the four internal wall surfaces of the package holding pocket 11c so that the positioning bush 60 can be fixed.

The positioning bush 60 may be designed with larger height, thereby increasing the contact area with respect to the side surfaces of the semiconductor package. This makes it possible to position the semiconductor package 40 more accurately.

Figure 13:
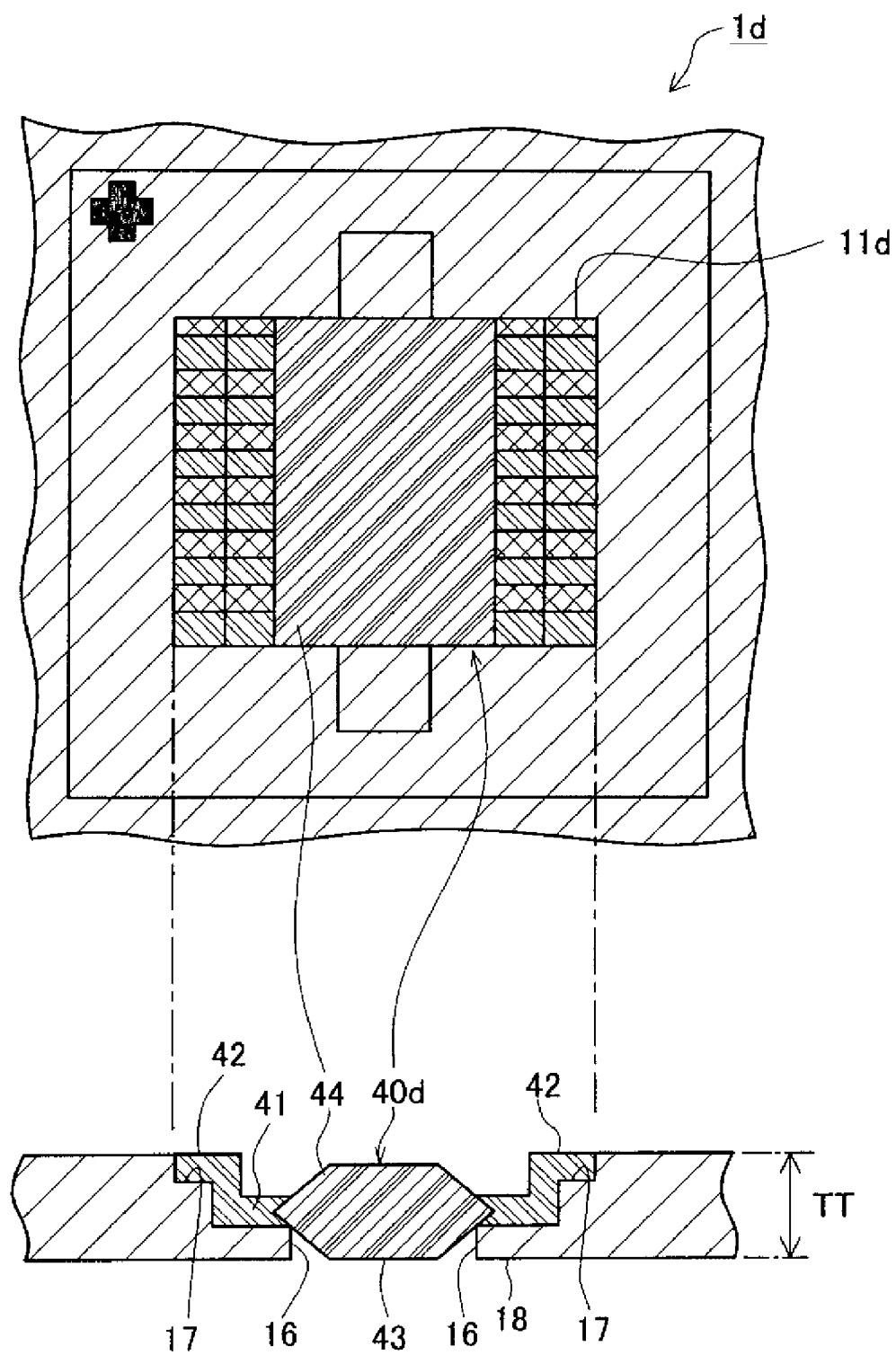
FIG. 13 is a top view and a section view of a carrier tray 1d of a fourth embodiment.
Figure 14:
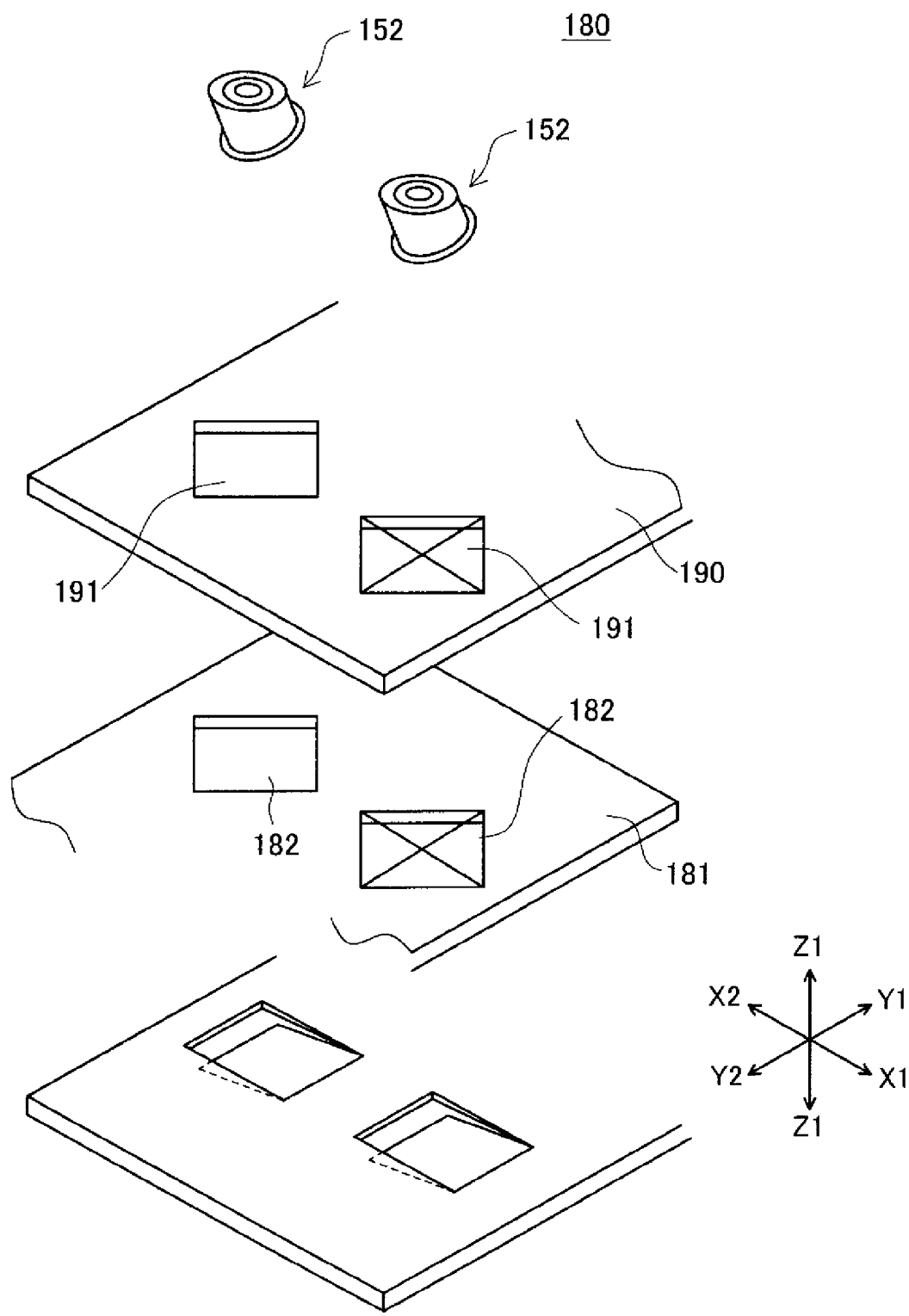
FIG. 14 is an exploded view showing a positioning device 180 disclosed in a related art.
Figure 15:
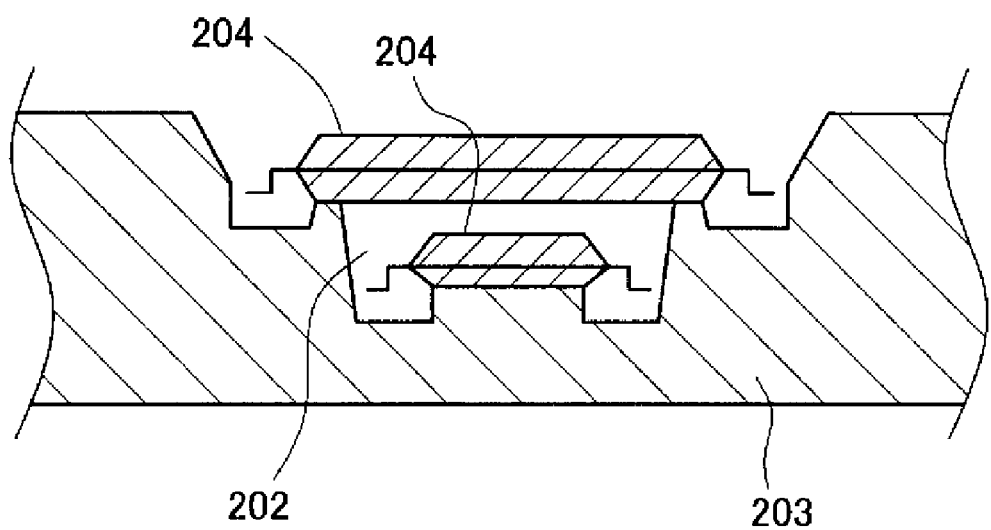
FIG. 15 is a partial section view of a plate-like substrate 203 disclosed in another related art.

A fourth embodiment will be explained referring to FIG. 13 which is a partial section view of a carrier tray 1d of the fourth embodiment. The carrier tray 1d is formed with package holding pockets 11d each having a rectangular shape in top view. In each package holding pocket 11d, a semiconductor package 40d including a molded part 44 and lead wires 41 horizontally protruding therefrom is placed. Each package holding pocket 11d is provided with a through hole 16 formed though the carrier tray 1d. The package holding pocket 11d includes support portions 17 configured to have surface contact with the lead wires 41 to support the semiconductor package 40d. Each support portion 17 is made of an insulating material. The thickness TT of the carrier tray 1d is determined to be a value lower than the height of the semiconductor package 40d from a joint surface 42 of each lead wire 41 to a top surface (a lower surface in the figure) 43 of the molded part 44.

The operation of the package holding pocket 11d is explained below. The semiconductor package 40d is placed in the package holding pocket 11d with the lead wires 41 being supported by the support portions 17. The top surface 43 of the molded part is exposed at a lower surface 18 though the through hole 16. The thickness TT of the carrier tray 1d is determined to the value lower than the distance between the joint surface 42 of each lead wire 41 and the top surface 43 of the molded part of the semiconductor package 40d, so that the top surface 43 of the semiconductor package 40d is flush with the lower surface 18 of the carrier tray 1d or protrudes downward from the lower surface 18. In a heat test, for example, the carrier tray 1d is placed on a hot plate, when the top surface 43 of the semiconductor package 40d can be brought in direct contact with the hot plate through the through hole 16.

As explained above in detail, according to the carrier tray 1d of the fourth embodiment, a direct work or action can be applied to the molded part of the semiconductor package through the through hole opening at the lower surface of the carrier tray. Specifically, the molded part can be heated directly, which makes it possible to enhance the efficiency and accuracy of temperature control. Further, a bottom portion of the package holding pocket 11d is unnecessary, so that a further reduction in thickness of the carrier tray 1d can be achieved.

The present embodiment may be embodied in other specific forms without departing from the essential characteristics thereof. In the above embodiments, the semiconductor packages of the BGA type are mainly explained. However, the present embodiment is not limited to the above semiconductor packages and of course can be applied to any other types of semiconductor packages such as BCC (Bump Chip Carrier), QFN (Quad Fiat Non-leaded Package), SSOP (Shrink Small Outline Package), QFP (Quad Flat Package), SiP (System in Package), Super CSP (Super Chip Size Package), WLCSP (Wafer Level Chip Size Package). The present embodiment can also be applied to even a bare chip not yet packaged.

Figure 16:
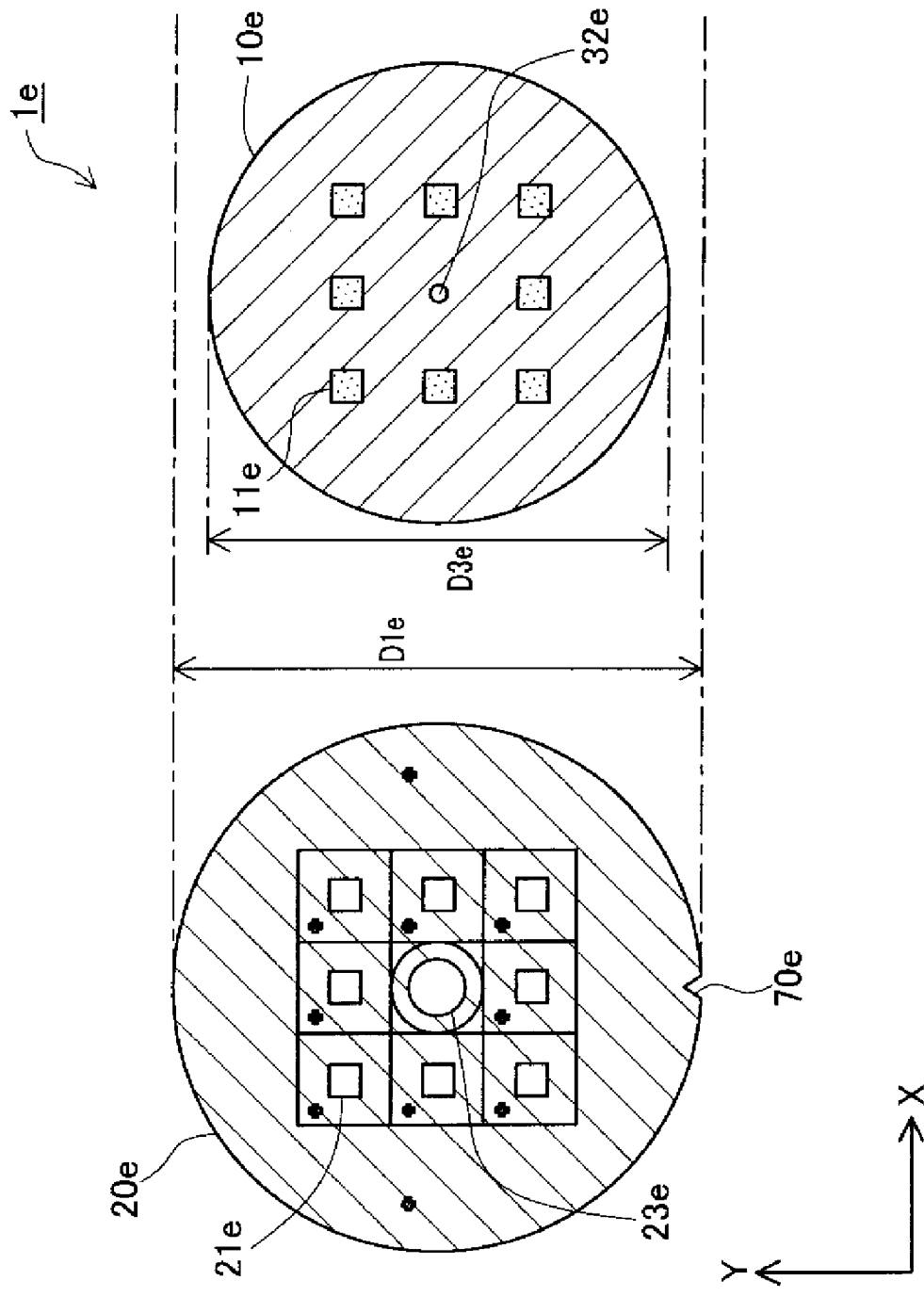
FIG. 16 is an exploded view of a carrier tray 1e.

In the first embodiment, the carrier tray 1 comprises three trays; the lowermost tray 10, uppermost tray 20, and intermediate tray 30, but not limited to such configuration. It may be designed as a carrier tray 1e shown in FIG. 16 comprising two trays, a lower tray 10e and an upper tray 20e. The lower tray 10e is formed with package holding pockets 11e arranged in a matrix and a screw hole portion 32e in the center. In this screw hole portion 32e, a countersunk screw 22e is screwed as mentioned later. The upper tray 20e is provided with measuring windows 21e arranged in a matrix to match the package holding pockets 11e in number and location. The upper tray 20e is formed with a circular slide-lever opening 23e.

The upper tray 20e is of a circular shape with a diameter D1e equal to the diameter of a semiconductor wafer to be handled in the prober. The lower tray 10e is of a circular shape with a diameter D3e smaller than the diameter D1e of the upper tray 20e. The upper tray 20e is provided with a notch 70e for parallel adjustment with the X- or Y-axis of the prober as with the semiconductor wafer.

The carrier tray 1e is arranged such that the upper tray 20e is placed on the lower tray 10e. The slide-lever opening 23e is provided in a location corresponding to the screw hole portion 32e, so that the screw hole portion 32e protrudes through the opening 23e. The slide-lever opening 23e is designed to have a larger diameter than the diameter of the screw hole portion 32e. Accordingly, the lower tray 10e is allowed to slide freely in both X and Y directions in a range that the screw hole portion 32e stays within the slide-lever opening 23e. A countersunk screw 22e not illustrated is screwed in the screw hole portion 32e. Other structures of the carrier tray 1e are identical to those of the carrier tray 1 of the first embodiment and therefore their explanations are not repeated below.

Figure 17:
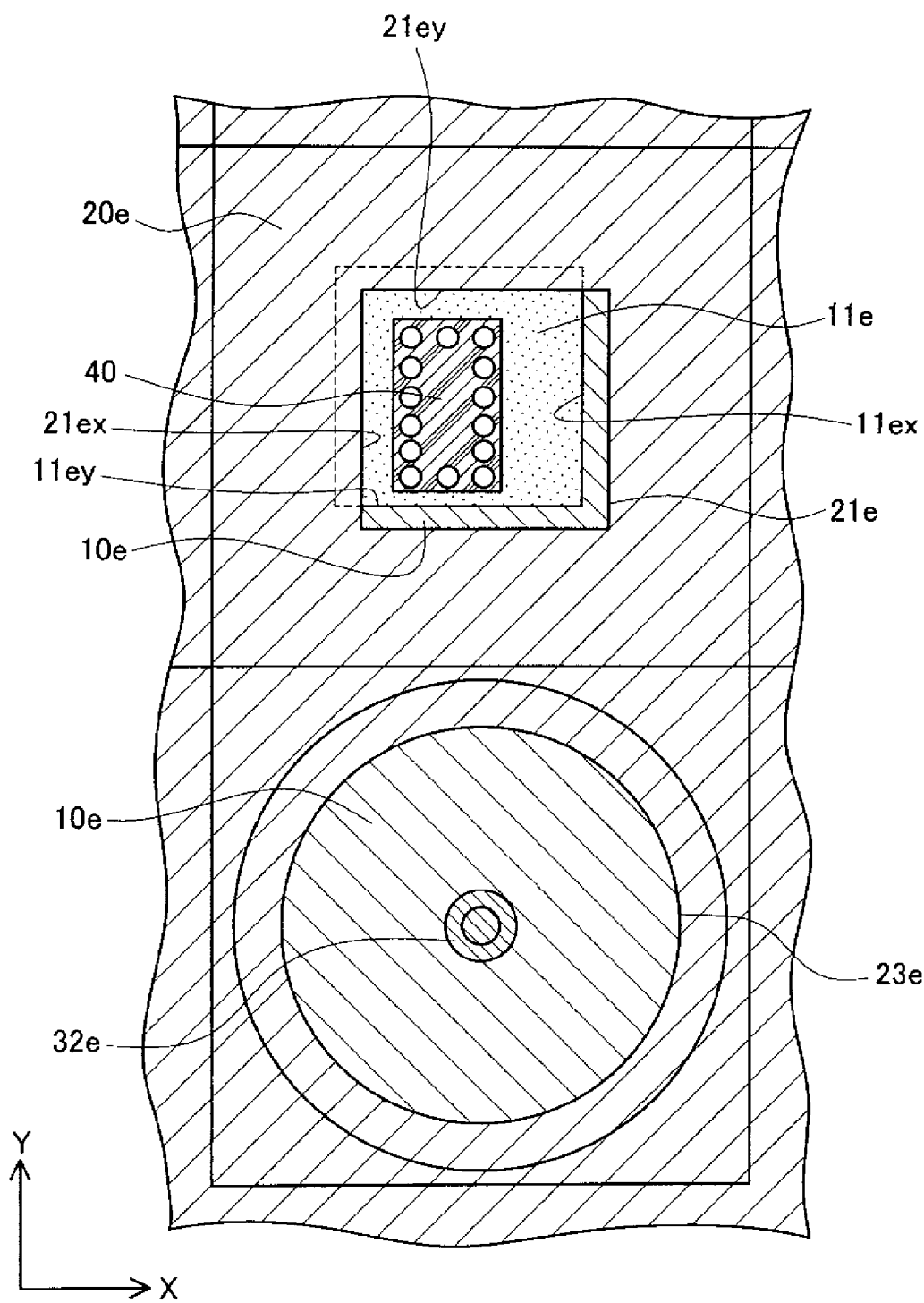
FIG. 17 is a partial enlarged top view (No. 1) of the carrier tray 1e.
Figure 18:
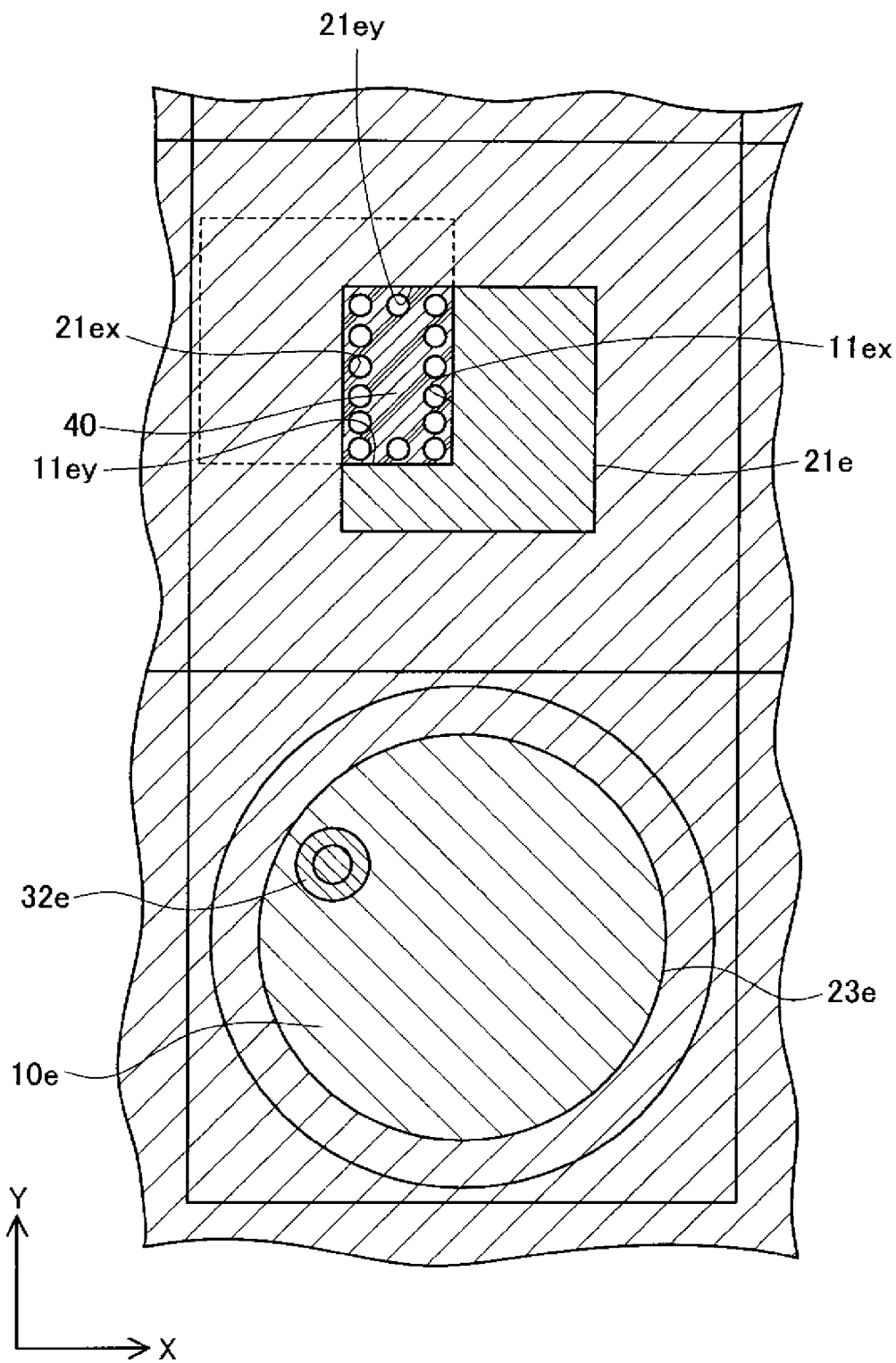
FIG. 18 is a partial enlarged top view (No. 2) of the carrier tray 1e.

The operation of the carrier tray 1e is explained referring to FIGS. 17 and 18 which are partial enlarged top views of the carrier tray 1e, showing the measuring window 21e and the slide-lever opening 23e.

(1) Firstly, the semiconductor package 40 is temporarily placed in the package holding pocket 11e of the lower tray 10e.

(2) Secondary, the upper tray 20e is placed on the lower tray 10e. As shown in FIG. 17, the opening formed by the package holding pocket 11e and the measuring window 21e are larger in size in the X and Y directions than the semiconductor package 40, with the result that a clearance is generated between the opening and the semiconductor package 40.

(3) Leftward force in the X direction is applied to the screw hole portion 32e, moving the lower tray 10e leftward in the figure, so that the size of the opening in the X direction is narrowed. By the edge 21ex of the measuring window 21e and the edge 11*ex* of the package holding pocket 11*e*, the semiconductor package 40 is clamped and positioned in place in the X direction.

(4) Upward force in the Y direction is similarly applied to the screw hole portion 32*e*, moving the lower tray 10*e* upward in the figure, so that the size of the opening in the Y direction is narrowed. By the edge 11*ey* of the package holding pocket 11*e* and the edge 21*ey* of the measuring window 21*e*, the semiconductor package 40 is clamped and positioned in place in the Y direction. The semiconductor package 40 is thus positioned in the upper left corner of the measuring window 21*e* in contact with the edges 11*ex* and 21*ex* in the X direction and in contact with the edges 11*ey* and 21*ey* in the Y direction of the package holding pocket 11*e* and the measuring window 21*e*, as shown in FIG. 18. Consequently, positioning of the semiconductor package 40 in the X and Y coordinates is uniquely conducted relative to the carrier tray 1*e*.

(5) After completion of the positioning, the countersunk screw 22*e* not shown screwed in the screw hole portion 32*e* of the lower tray 10*e* is turned until the lower surface of the countersunk screw 22*e* is brought into contact with the upper surface of the upper tray 20*e*, thereby securing the lower tray 10*e* to the upper tray 20*e*.

(6) After completion of the positioning and locking of the semiconductor package 40 in the carrier tray 1*e*, the carrier tray 1*e* is placed in the prober and subjected to a test process.

As described above in detail, the carrier tray 1*e* holds the semiconductor package 40 in the lower tray 10*e*. With the lower tray 10*e* and the upper tray 20*e*, positioning of the semiconductor package 40 is carried out. By these two trays, the position coordinates of the semiconductor package relative to the carrier tray can be determined uniquely.

The slide-lever opening 23*e* is of a circular open shape, which allows the slide lever to slide with equal amounts (distances) in the X and Y directions respectively. This makes it possible to carry out the positioning of the rectangular semiconductor package 40 of different lengths in the X and Y directions. In either case of a package longer in the X direction than in the Y direction and a package longer in the Y direction than in X direction, the positioning thereof can be made accurately.

The diameter D1*e* of the upper tray 20*e* is set to be equal to the diameter of the semiconductor wafer. In this case, the positioning of the semiconductor package 40 is carried out by changing the position of the lower tray 10*e* relative to the upper tray 20*e*. Even when the lower tray 10*e* is moved, the positions of the alignment marks and the scribe lines provided on the upper surface of the upper tray 20*e* will not change when viewed from above the carrier tray 1*e*. Therefore, in setting the carrier tray 1*e* in the prober, the positioning of the carrier tray 1*e* can be performed easily. Of course the transfer tray 1*e* may comprise a lower tray 10*e* of a diameter equal to that of the semiconductor wafer and an upper tray 20*e* of a diameter smaller than the lower tray 10*e*.

In the first embodiment, as a manner of locking the lowermost tray 10 and the uppermost tray 20 to each other, the retaining frames 50*a* and 50*b* are used to retain the entire circumferences of those trays 10 and 20, but another configuration may be adopted. For example, at least two points of the outer circumferences of the lowermost tray 10 and the uppermost tray 20 have only to be locked for fixation. The fixing manner may also include clamping the lowermost tray 10 and the uppermost tray 20 by use of a clip, for example. Alternatively, the fixing manner may use only the spacer screw 22 without the retaining frames 50*a* and 50*b*.

Although the spacer screw 22 that can be screwed by hand is for use with the first embodiment, any other screws are also available. For example, instead of the spacer screw 22, a countersunk screw that is screwed by use of a screwdriver or the like may be used.

In the above embodiment, the spacer screw 22 serving as a lever for sliding the intermediate tray 30 is placed extending in the Z direction relative to the intermediate tray 30. Alternatively, the spacer screw 22 may be positioned on the side surface of the carrier tray 1 (in the X or Y axis direction). This allows efficient use of the whole area of the tray surface, resulting in an increase in number of the semiconductor packages 40 to be placed in the tray. Further, the position of the spacer screw 22 is not limited to almost the center of the intermediate tray 30 and may be in a peripheral region of the intermediate tray 30. This also allows efficient use of the tray surface. Moreover, the carrier tray may be provided with a plurality of spacer screws 22 to further increase the fixing or locking strength.

In the above embodiment, the carrier tray is made of aluminum but not limited thereto. Any materials may be used; for example, resin, silicon, copper, SUS, stainless, other alloys, and ceramic. In response to recent demands for a reduction in size and thickness of semiconductor packages, the use of a metallic material is preferable to produce a low-profile carrier tray. In this case, any portions needing insulation such as a contact area between device terminals or the like and the tray should be subjected to treating with resins, coating with insulating materials, or baking for insulation.

In the above embodiment, the package holding pockets 11, 11*c*, 11*d*, and 11*e* and the slide-lever openings 23, 23*a*, 23*b*, and 34 are each rectangular in shape but not limited thereto. They may be formed in any other shapes; e.g., circular, elliptical, trapezoidal, rhomboidal, triangular, polygonal, cross, X-letter, or others, which allow the positioning of the semiconductor packages. For instance, the slide-lever opening 23 is rectangular in the first embodiment and, alternatively, may be circular. In this case, the circular slide-lever opening 23 allows the slide lever to slide with equal amounts (distances) in the X and Y directions. This is advantageous to a reduction in limitation on the package shape.

In the third embodiment, the positioning bush 60 is of the shape to fill the clearance between the package holding pocket 11*c* and the semiconductor package 40*c*, but it may be formed in any other shape. For example, the positioning bush may be made of a gel-like material such as a silicone solution, so that it may be deformed to match the shape of a semiconductor package. Thus, the positioning of different-shaped semiconductor packages can be carried out by a single positioning bush, which can achieve a further reduction in cost.

Note that the lowermost tray 10 is an example of a first tray; the intermediate tray 30 is an example of a second tray; the X direction is an example of a first direction; the Y direction is an example of a second direction; the X-direction intermediate tray 30*a* is an example of a first-direction tray; the Y-direction intermediate tray 30*b* is an example of a second-direction tray; the package holding pockets 11, 11*c*, and 11*d* are examples of a holding part; the measuring window 21 is an example of a second window; the screw hole portions 32, 32*a*, and 32*b* are examples of a protruding portion; the slide-lever openings 23, 23*a*, and 23*b* are examples of a slide hole; and the positioning bushes 60 and 60*a* are examples of a positioning member.

According to the present embodiment, it is possible to provide a carrier tray for use with a prober, capable of allowing the prober to measure or test not only semiconductor wafers but also semiconductor packages and enabling accurate positioning of each of different-shaped semiconductor packages.

While the presently preferred embodiment of the present embodiment has been shown and described, it is to be understood that this disclosure is for the purpose of illustration and that various changes and modifications may be made without departing from the scope of the invention as set forth in the appended claims.

The embodiment has an object to provide a carrier tray for use with a prober, capable of allowing the prober to measure or test not only semiconductor wafers but also semiconductor packages and enabling appropriate positioning of each of different-shaped semiconductor packages.

The embodiment provides a carrier tray for a semiconductor package, which is used in a test of the semiconductor package by a prober for testing a semiconductor wafer, the carrier tray comprising: a first tray provided with a plurality of rectangular holding parts arranged in a matrix, each of which has a depth smaller than thickness of the semiconductor package and is configured to hold the semiconductor package; and a second tray provided with a plurality of first windows arranged in correspondence with the plurality of rectangular holding parts, each first window being of a rectangular shape to surround each semiconductor package, and the second tray being placed in contact with the first tray; wherein the first and second trays are slidable relative to each other, one of the first and second trays is of an outer diameter equals to an outer diameter of the semiconductor wafer to be handled by the prober and an outer edge of the outer tray stays within a range corresponding to an outer edge of one of the first and second trays during sliding.

The carrier tray for semiconductor package is a tray to be used in a test of semiconductor packages by a prober for testing semiconductor wafers. The first tray is provided with a plurality of rectangular holding parts arranged in a matrix, each of which has a depth smaller than the thickness of each semiconductor package to individually hold the semiconductor package. The second tray is provided with rectangular first windows arranged in a one-to-one correspondence with the holding parts to surround each semiconductor package. The second tray is placed in contact with the first tray. One of the first and second trays is formed with an outer diameter equal to that of the semiconductor wafer to be handled in the prober. Those trays are slidable relative to each other so that the outer edge of the other tray stays within the range corresponding to the outer edge of the former tray.

Each opening is formed by the holding part and the first window which overlap each other. Mutual sliding of the first and second trays allows changes of the size and shape of each opening. In a test, a semiconductor package is first put in the holding part. In this state, there is a clearance between the semiconductor package and the opening (the internal surfaces thereof). The first and second trays are then moved to slide relative to each other, narrowing or closing the opening, so that the semiconductor package is clamped by the holding part of the first tray and the first window of the second tray without leaving any clearance between the semiconductor package and the opening. Thus, the position coordinates of the semiconductor package relative to the carrier tray is uniquely determined.

In the carrier tray according to the present embodiment, the shape of the opening formed of the overlapping area of the holding part and the first window can be changed. Accordingly, the carrier tray imposes no limitation on the shape of semiconductor package to be held, enabling handling of different-shaped semiconductor packages. This eliminates the need for producing a tray designed for each package. It is therefore possible to achieve a reduction in testing cost and an increase in throughput.

One of the first and second trays is of an outer diameter equal to that of the semiconductor wafer to be handled in the prober. Those trays are mutually slid so that the outer edge of the other tray stays within the range corresponding to the outer edge of the former tray. Thus, this sliding will not cause any change of the outer shape, or outer size, of the carrier tray. Accordingly, the outer shape of the carrier tray is equal to that of the semiconductor wafer, so that the carrier tray can be handled in the same manner as the semiconductor wafer. This makes it possible to test the semiconductor package by use of the prober for testing semiconductor wafers without any modifications thereof.

According to another aspect, the embodiment provides a carrier tray for a semiconductor package, which is used in a test of the semiconductor package by a prober for testing a semiconductor wafer, the carrier tray comprising: a plurality of rectangular holding parts arranged in a matrix, each of which is configured to hold each semiconductor package; and a positioning member forming at least part of an inner periphery of each rectangular holding part, the positioning member being of a shape determined according to a shape of the semiconductor package to fill a clearance between the rectangular holding part and the semiconductor package when placed in the rectangular holding part, wherein the carrier tray is of an outer diameter equals to an outer diameter of the semiconductor wafer.

The carrier tray is provided with the plurality of holding parts, each of which is of a rectangular shape, for holding therein a semiconductor package. If the semiconductor package is smaller than the holding part, a clearance is generated between the internal surface of the holding part and the semiconductor package. The positioning member is of a shape that fills the clearance between the internal surface of the holding part and the semiconductor package. The carrier tray has an outer diameter equal to that of the semiconductor wafer. The positioning member fills the clearance between the holding part and the semiconductor package. Thus, the position coordinates of the semiconductor package relative to the carrier tray is determined uniquely.

The carrier tray according to the embodiment can selectively use various positioning members to hold any semiconductor packages different in shape. This can eliminate the need for producing a carrier tray designed for each package, resulting in a reduction in test cost. By using various positioning members, furthermore, one carrier tray can hold semiconductor packages of several different shapes at a time. This makes it possible to test semiconductor packages in many different kinds and in small batches.

Further, the outer diameter of the carrier tray is set to be equal to that of the semiconductor wafer to be handled in the prober. Accordingly, the test of the semiconductor package can be carried out by the prober for testing a semiconductor wafer without any modifications.

The carrier tray may also be formed of a single tray, achieving a reduction in thickness of the carrier tray.

Furthermore, according to another aspect, the embodiment provides a carrier tray for a semiconductor package, which is used in a test of the semiconductor package with a prober for testing a semiconductor wafer, the carrier tray comprising: a plurality of holding parts each having a through hole formed through the carrier tray and being configured to hold each semiconductor package that includes a molded part and a lead wire horizontally extending from the molded part, the holding parts being arranged in a matrix, each holding part being provided with a support portion configured to support the lead wire in contact relation to hold the semiconductor package.

The carrier tray is formed with the plurality of holding parts arranged in a matrix. Each holding part includes the through hole formed through the carrier tray. Each holding part is further provided with the support portion which will support the lead wires in contact relation to hold the semiconductor package. In each holding part, a semiconductor package including a molded part with the lead wires horizontally protruding therefrom can be placed.

The semiconductor package can be placed in the holding part when the support portion which supports the lead wires. Accordingly, through the through hole, at least part of the molded part is exposed at the lower surface of the carrier tray. This enables a direct operation on the molded part of the semiconductor package through the through hole that opens at the lower surface of the carrier tray. When the carrier tray is disposed on a hot plate in a heat test, for instance, the molded part can be heated directly through the through hole, which makes it possible to enhance the efficiency and accuracy of temperature control. Since the bottom of the holding part is unnecessary, a further reduction in thickness of the carrier tray can be achieved.

The above and further objects and novel features of the embodiment will more fully appear from the following detailed description when the same is read in connection with the accompanying drawings. It is to be expressly understood, however, that the drawings are for the purpose of illustration only and are not intended as a definition of the limits of the invention.

What is claimed is:

1. A carrier tray for a semiconductor package, which is used in a test of the semiconductor package by a prober for testing a semiconductor wafer, the carrier tray comprising:
   a first tray provided with a plurality of rectangular holding parts arranged in a matrix, each of which has a depth smaller than thickness of the semiconductor package and is configured to hold the semiconductor package; and
   a second tray provided with a plurality of first windows arranged in correspondence with the plurality of rectangular holding parts, each first window being of a rectangular shape to surround each semiconductor package, and the second tray being placed in contact with the first tray;
   wherein the first and second trays are slidable relative to each other, one of the first and second trays is of an outer diameter equals to an outer diameter of the semiconductor wafer to be handled by the prober and an outer edge of the other tray stays within a range corresponding to an outer edge of one of the first and second trays during sliding.

2. The carrier tray according to claim 1 further comprising a third tray provided with a plurality of second windows arranged in correspondence with the plurality of rectangular holding parts, wherein the third tray having an outer diameter equals to the semiconductor wafer and being placed on the second tray above the second tray.

3. The carrier tray according to claim 1, wherein the one of the first and second trays having the outer diameter equals to the outer diameter of the semiconductor wafer is provided with a notch or an orientation flat that is identical to a notch or an orientation flat of the semiconductor wafer.

4. The carrier tray according to claim 2, wherein the third tray is provided with either one of an alignment mark identical to an alignment mark of the semiconductor wafer and a specific alignment mark to the carrier tray.

5. The carrier tray according to claim 4, wherein the alignment mark includes a plurality of marks at least one of which is of a columnar shape having a predetermined height in a vertically upward direction from the tray.

6. The carrier tray according to claim 2, wherein the third tray is provided with a scribe line identical to a scribe line of the semiconductor wafer, the scribe line being arranged around each second window.

7. The carrier tray according to claim 6, wherein the third tray is of a circular shape, and the scribe line is formed to divide the second window in index size with reference to the center of the third tray.

8. The carrier tray according to claim 2, wherein
   the second tray is provided thereon with at least one protruding portion that extends vertically upward, and
   the third tray is provided with a slide hole to correspond to the protruding portion so that the protruding portion protrudes through the slide hole, and
   the second tray is slidable in a range that the protruding portion stays within an inner edge of the slide hole.

* * * * *